United States Patent
Ng et al.

(10) Patent No.: US 8,969,955 B2
(45) Date of Patent: Mar. 3, 2015

(54) POWER MOSFET AND METHODS FOR FORMING THE SAME

(75) Inventors: Chun-Wai Ng, Hsin-Chu (TW); Hsueh-Liang Chou, Jhubei (TW); Po-Chih Su, New Taipei (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/615,044

(22) Filed: Sep. 13, 2012

(65) Prior Publication Data

US 2013/0320437 A1 Dec. 5, 2013

Related U.S. Application Data

(63) Continuation-in-part of application No. 13/486,681, filed on Jun. 1, 2012.

(51) Int. Cl.
*H01L 29/78* (2006.01)

(52) U.S. Cl.
USPC .... 257/332; 257/327; 257/330; 257/E29.262; 438/259

(58) Field of Classification Search
USPC .................. 257/330, 339, 499, 500; 438/270
See application file for complete search history.

(56) References Cited

U.S. PATENT DOCUMENTS

| | | | |
|---|---|---|---|
| 7,427,795 B2 * | 9/2008 | Pendharkar | 257/335 |
| 8,278,731 B2 * | 10/2012 | Sumitomo et al. | 257/510 |
| 8,482,061 B2 | 7/2013 | Nishimura | |
| 2005/0001268 A1 * | 1/2005 | Baliga | 257/341 |
| 2005/0095789 A1 | 5/2005 | Blanchard | |
| 2006/0091455 A1 | 5/2006 | Adan | |
| 2007/0222024 A1 * | 9/2007 | Stecher | 257/499 |
| 2008/0057637 A1 * | 3/2008 | Choi | 438/199 |

(Continued)

FOREIGN PATENT DOCUMENTS

| KR | 20020000775 | 1/2002 |
|---|---|---|
| KR | 20080015863 | 2/2008 |

(Continued)

OTHER PUBLICATIONS

Goarin, P., et al., "Split-gate Resurf Stepped Oxide (RSO) MOSFETs for 25V applications with record low gate-to-drain charge," Proceedings of the 19$^{th}$ International Symposium on Power Semiconductor Devices & ICs, May 27-30, 2007, Jeju, Korea, IEEE.

*Primary Examiner* — Cheung Lee
*Assistant Examiner* — Stephen Bradley
(74) *Attorney, Agent, or Firm* — Slater & Matsil, L.L.P.

(57) ABSTRACT

A device includes a trench extending into a semiconductor region and having a first conductivity type, and a conductive field plate in the trench. A first dielectric layer separates a bottom and sidewalls of the field plate from the semiconductor region. A main gate is disposed in the trench and overlapping the field plate. A second dielectric layer is disposed between and separating the main gate and the field plate from each other. A Doped Drain (DD) region of the first conductivity type is under the second dielectric layer and having an edge portion overlapping the DD region. A body region includes a first portion at a same level as a portion of the main gate, and a second portion contacting the DD region, wherein the body region is of a second conductivity type opposite the first conductivity type. A MOS-containing device is at a surface of the semiconductor region.

21 Claims, 36 Drawing Sheets

(56) References Cited

U.S. PATENT DOCUMENTS

| | | |
|---|---|---|
| 2008/0258213 A1* | 10/2008 | Yilmaz et al. ............... 257/330 |
| 2009/0053880 A1* | 2/2009 | Manabe ....................... 438/524 |
| 2011/0241108 A1 | 10/2011 | Zuniga |
| 2012/0068231 A1 | 3/2012 | Garnett |
| 2012/0104490 A1 | 5/2012 | Yilmaz et al. |
| 2012/0196414 A1 | 8/2012 | Ngai et al. |

FOREIGN PATENT DOCUMENTS

| | | |
|---|---|---|
| TW | 1289355 | 11/2007 |
| TW | 201140841 | 11/2011 |
| TW | 201216473 | 4/2012 |

* cited by examiner

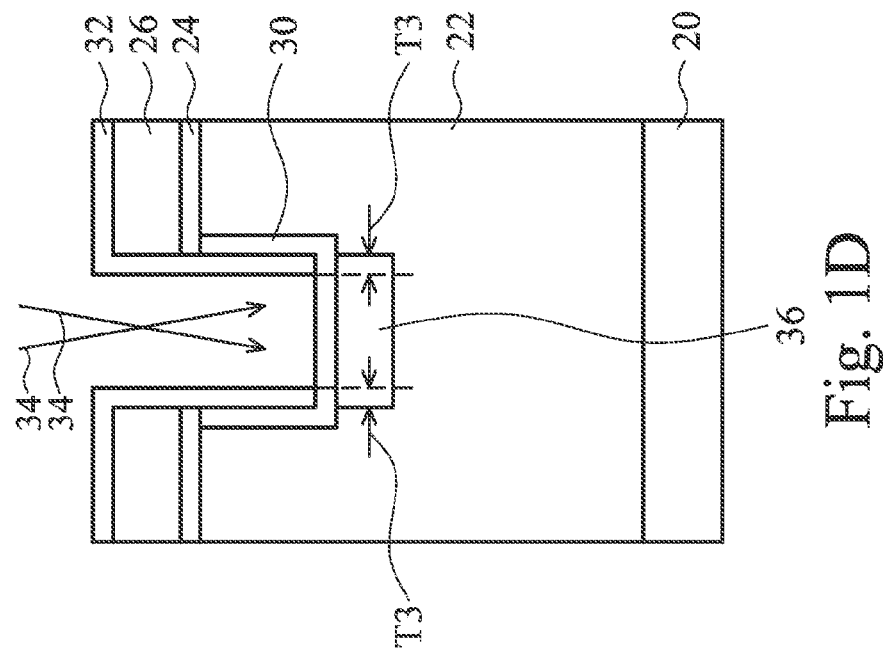
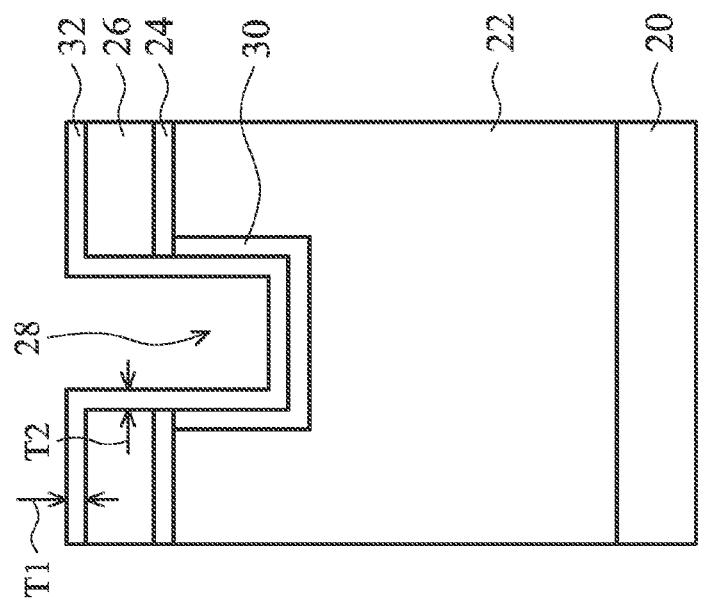
Fig. 1D
Fig. 1C

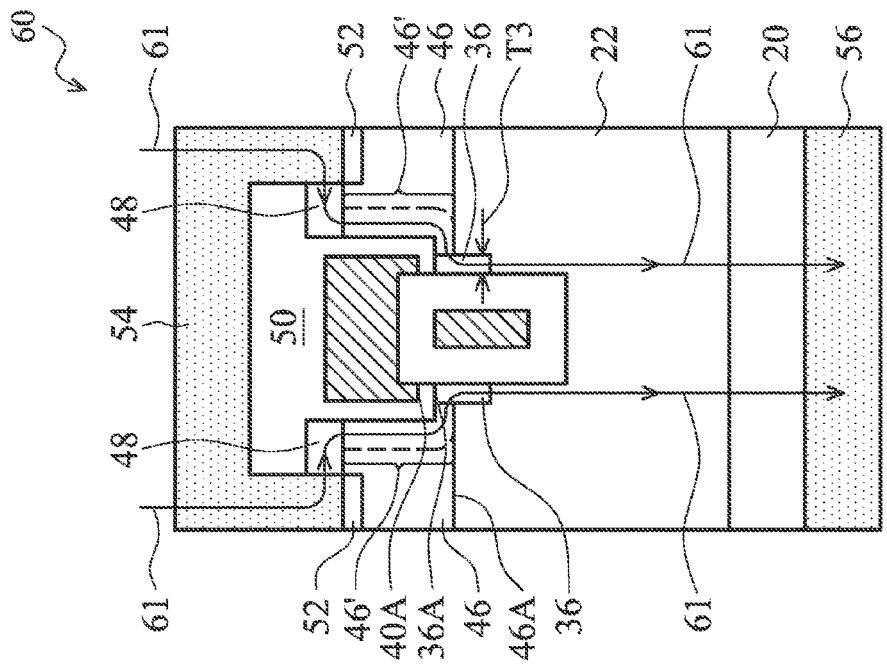
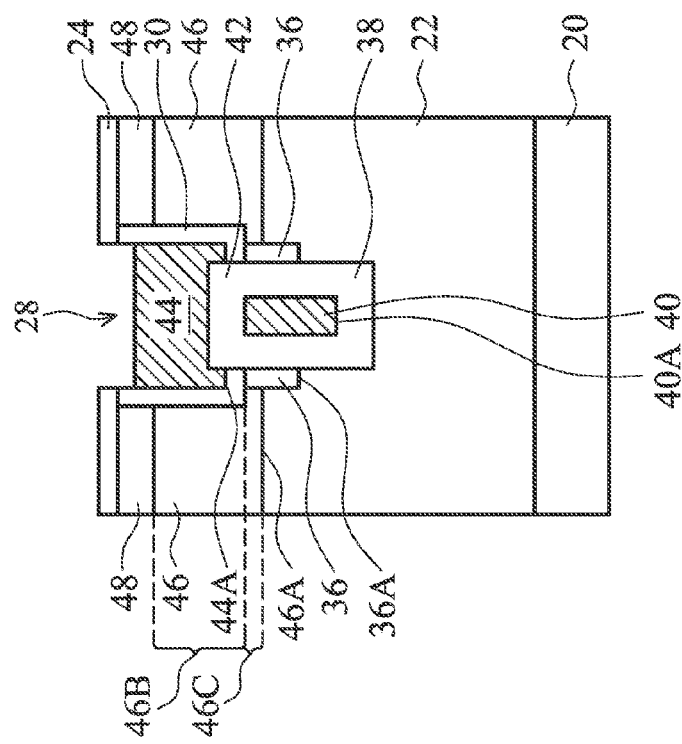
Fig. 1J
Fig. 1I

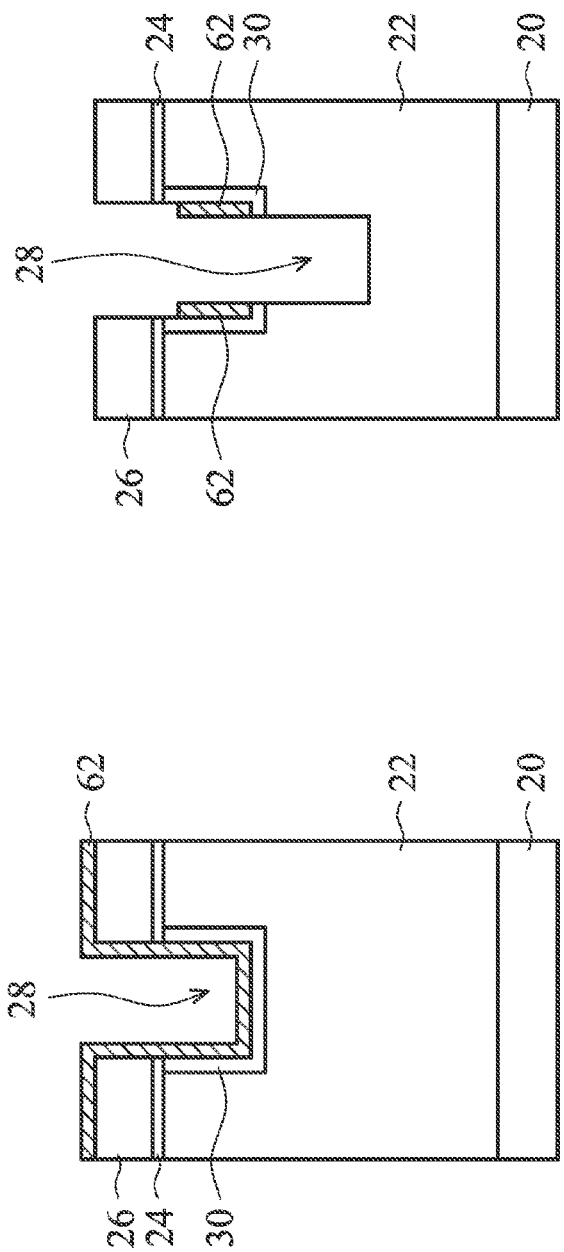

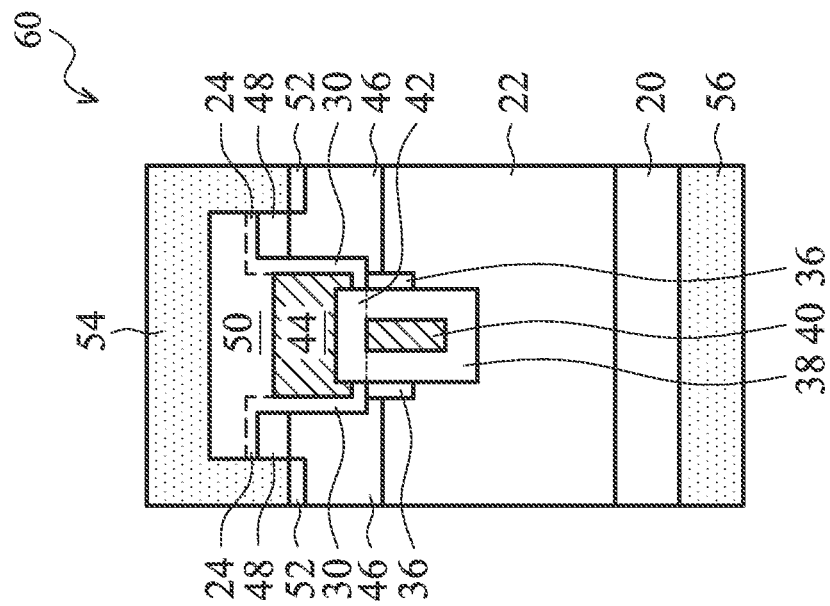
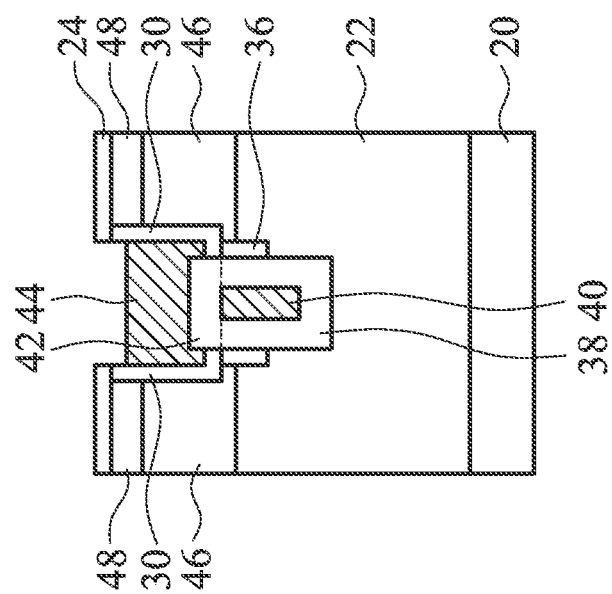
Fig. 3H
Fig. 3G

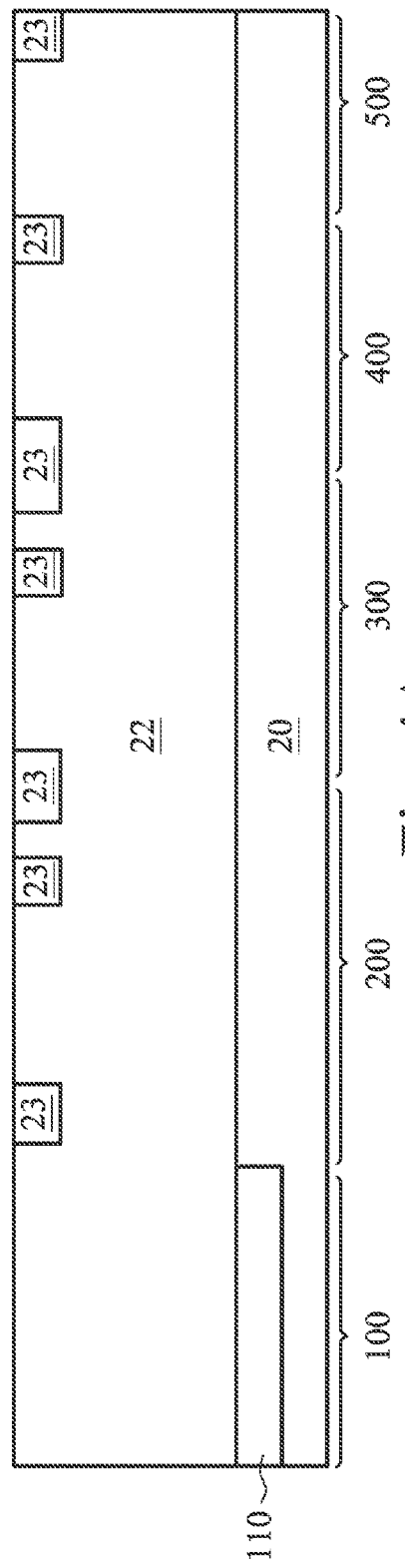
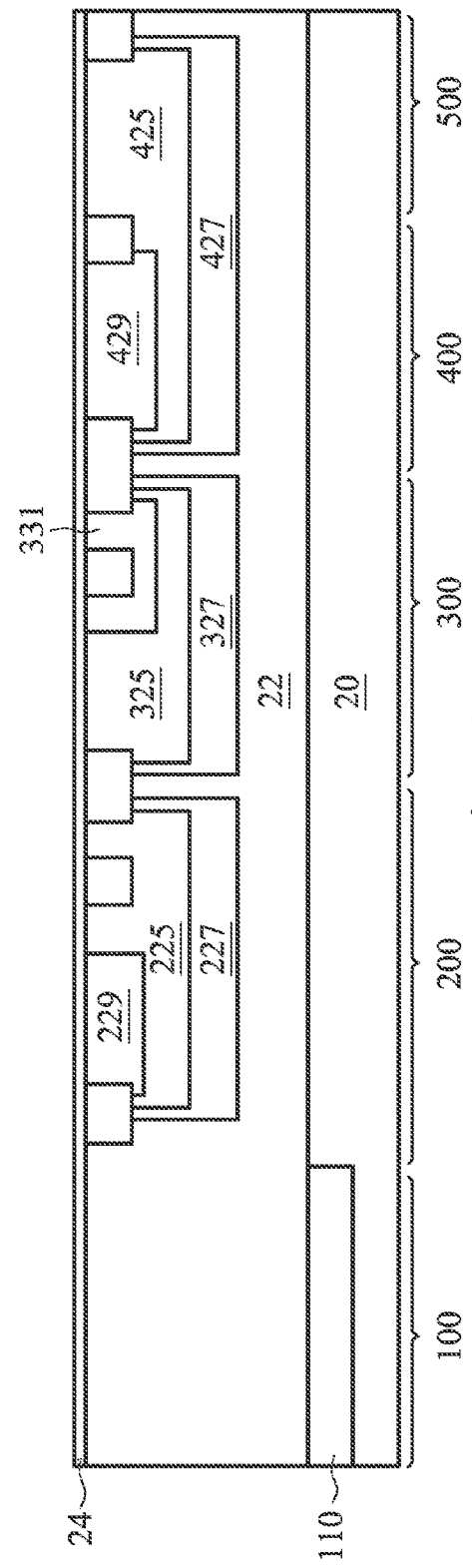

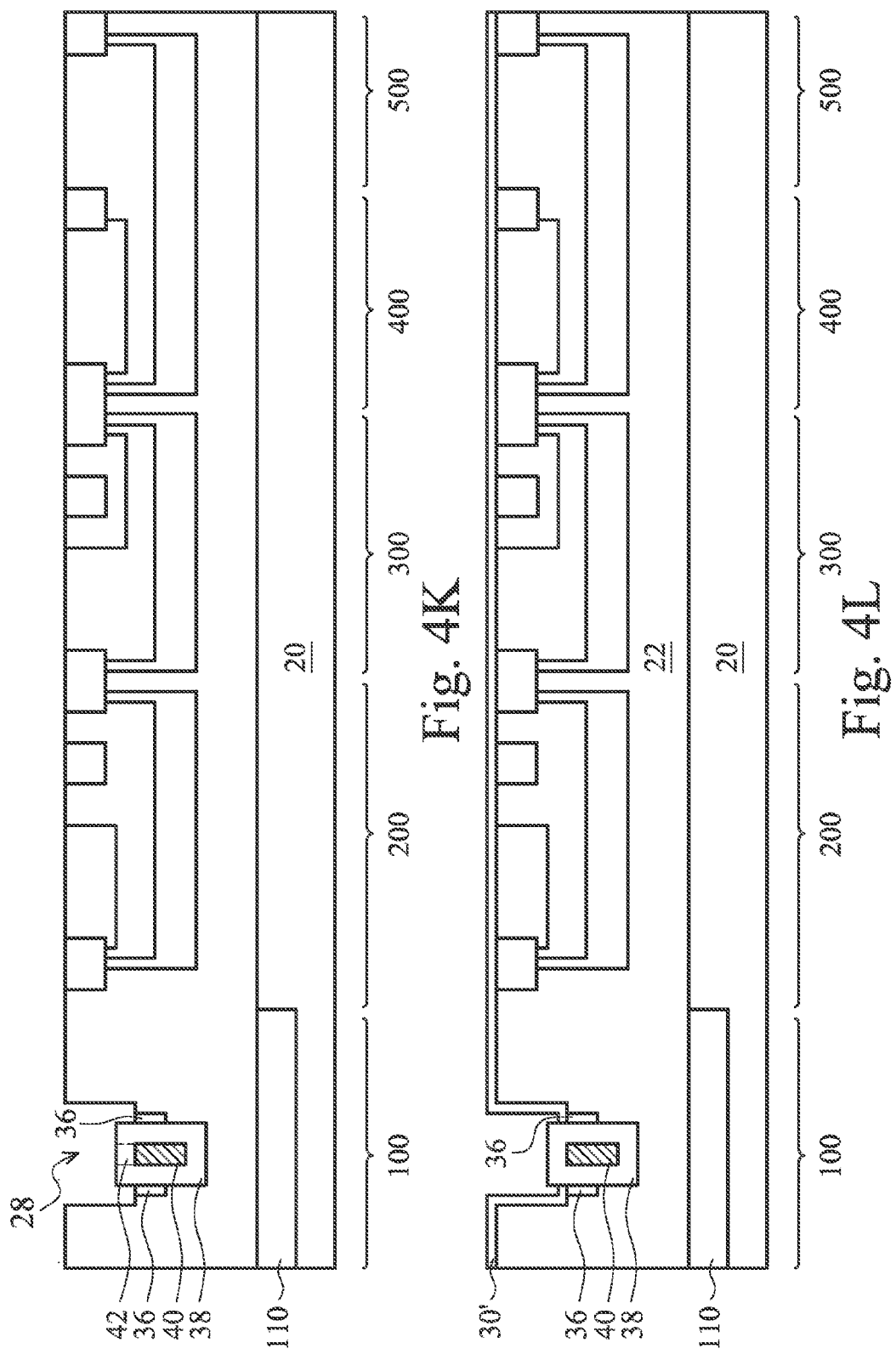

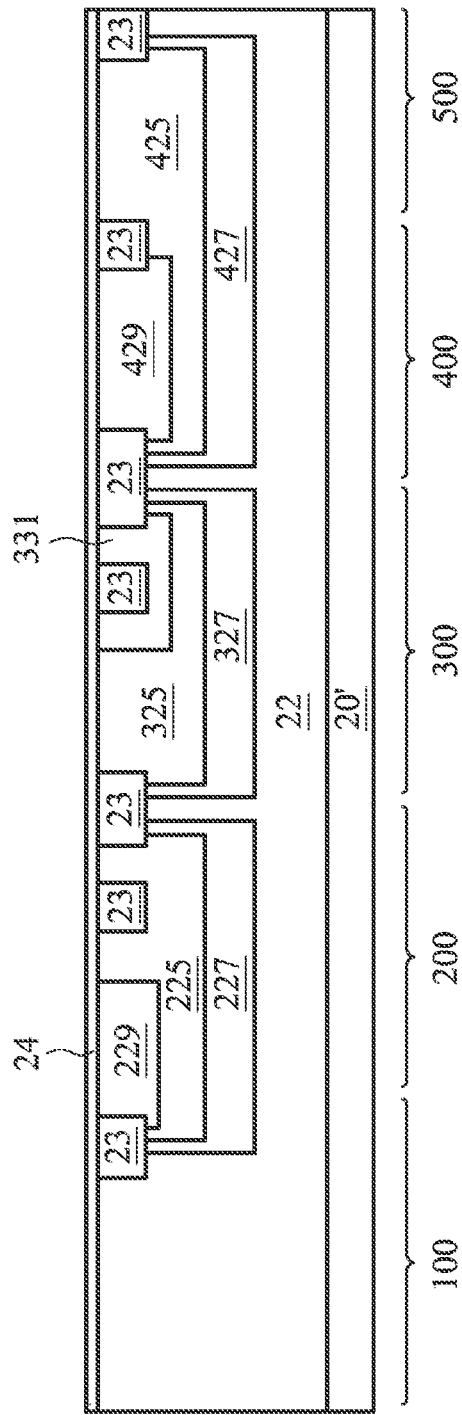
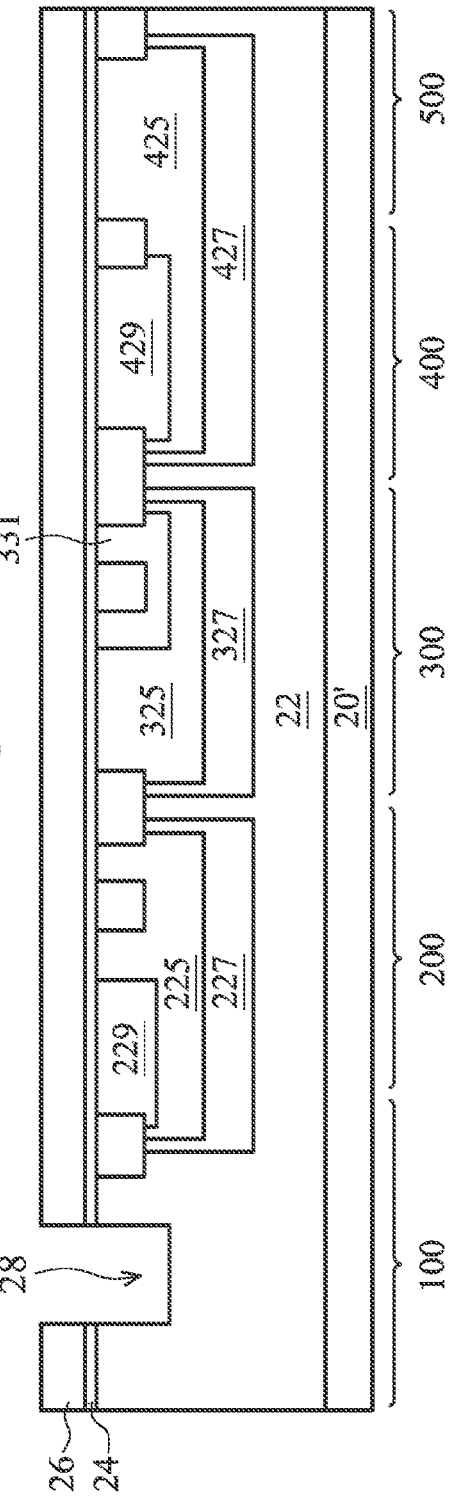
Fig. 6B
Fig. 6C

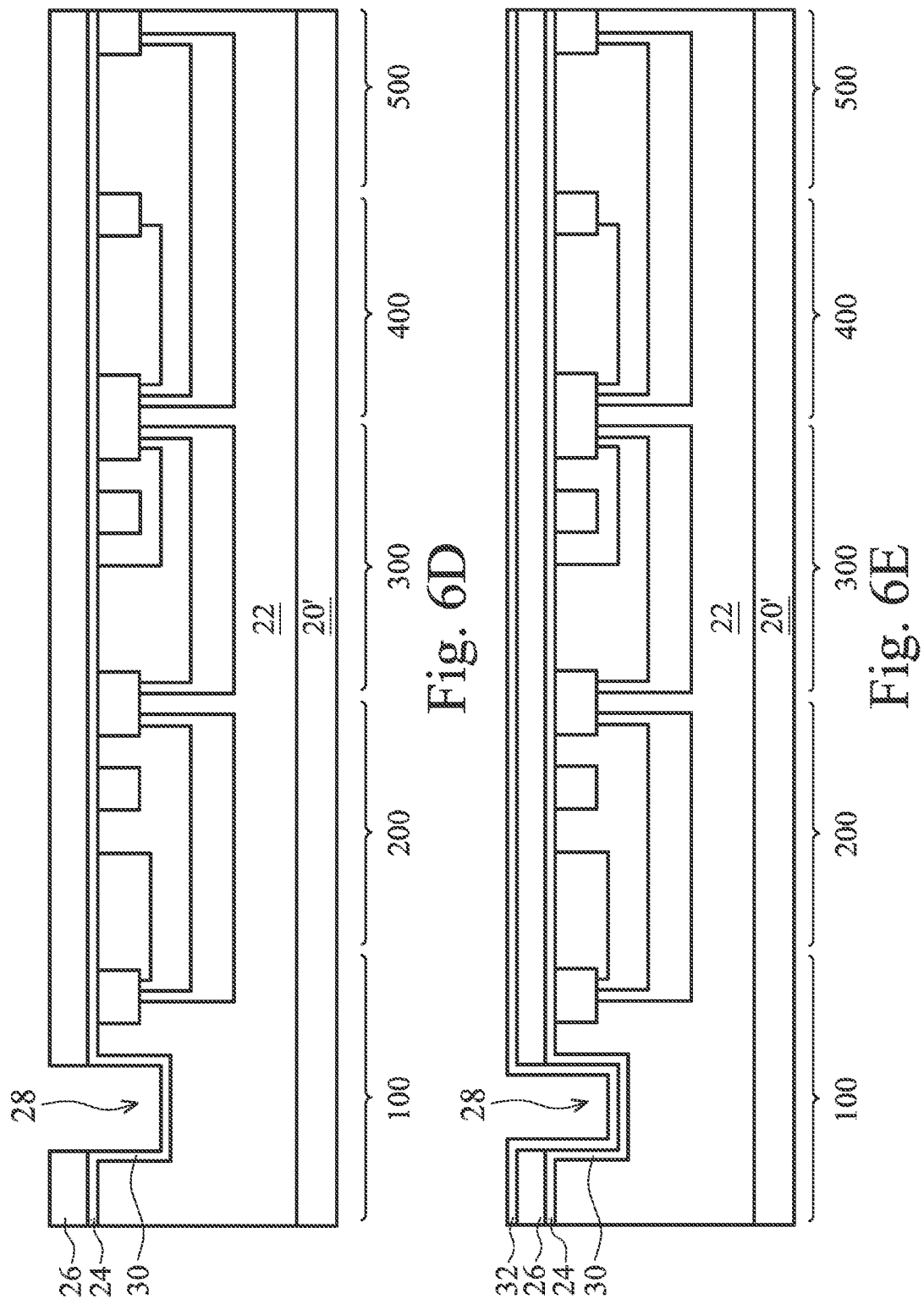

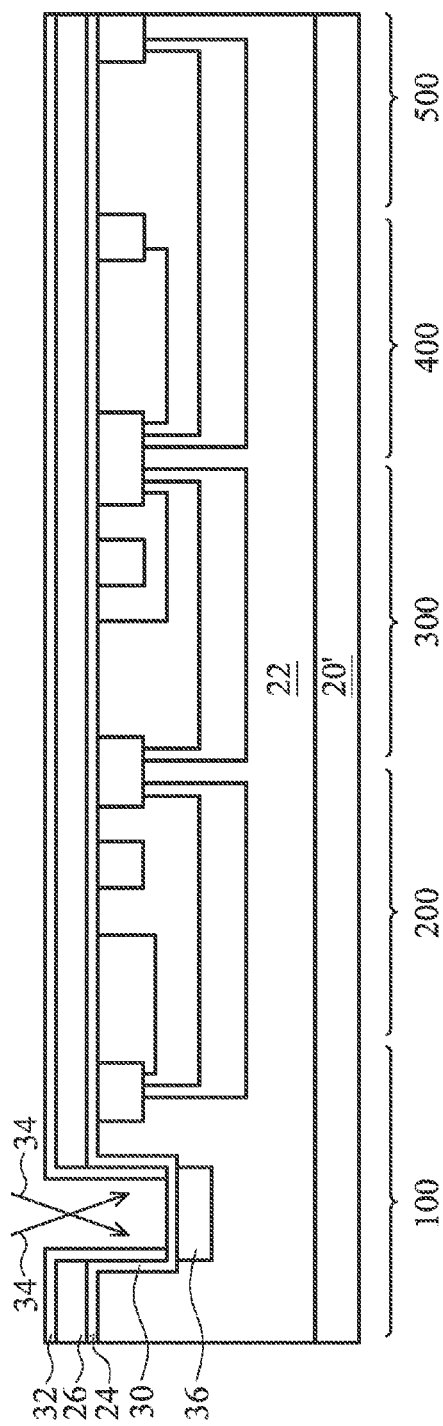
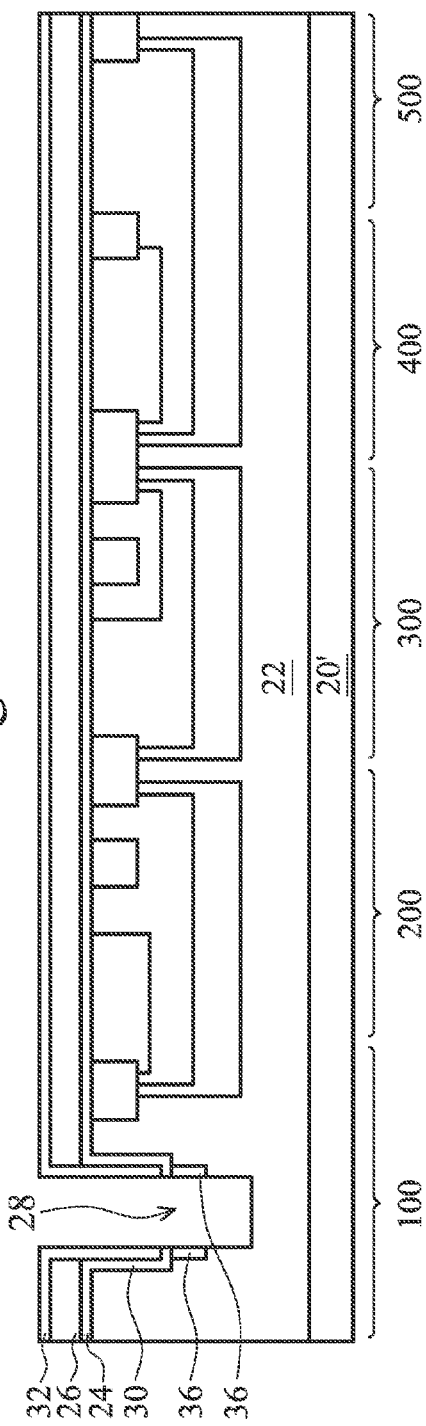

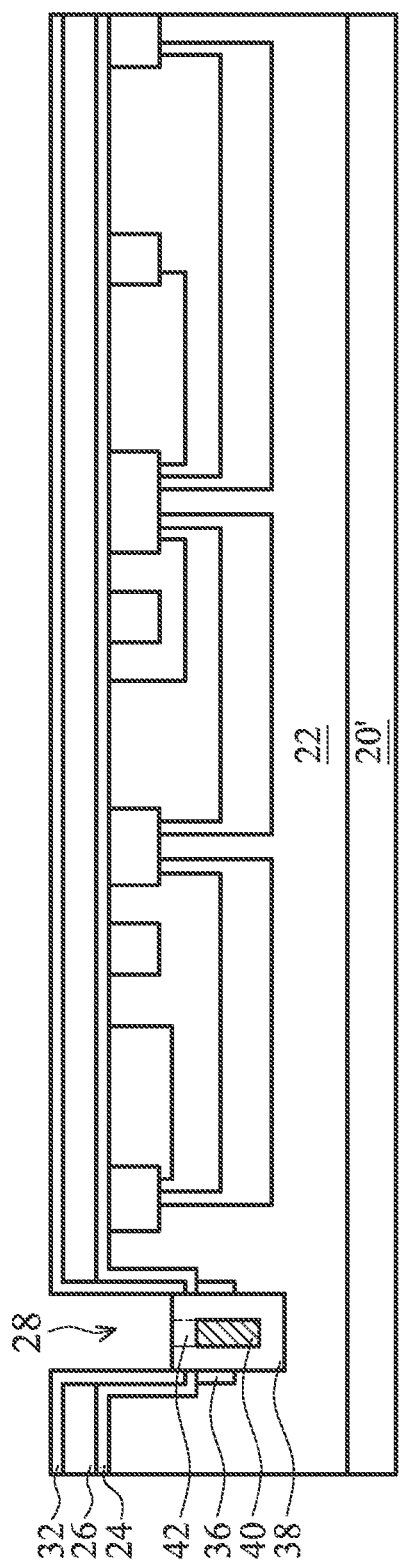
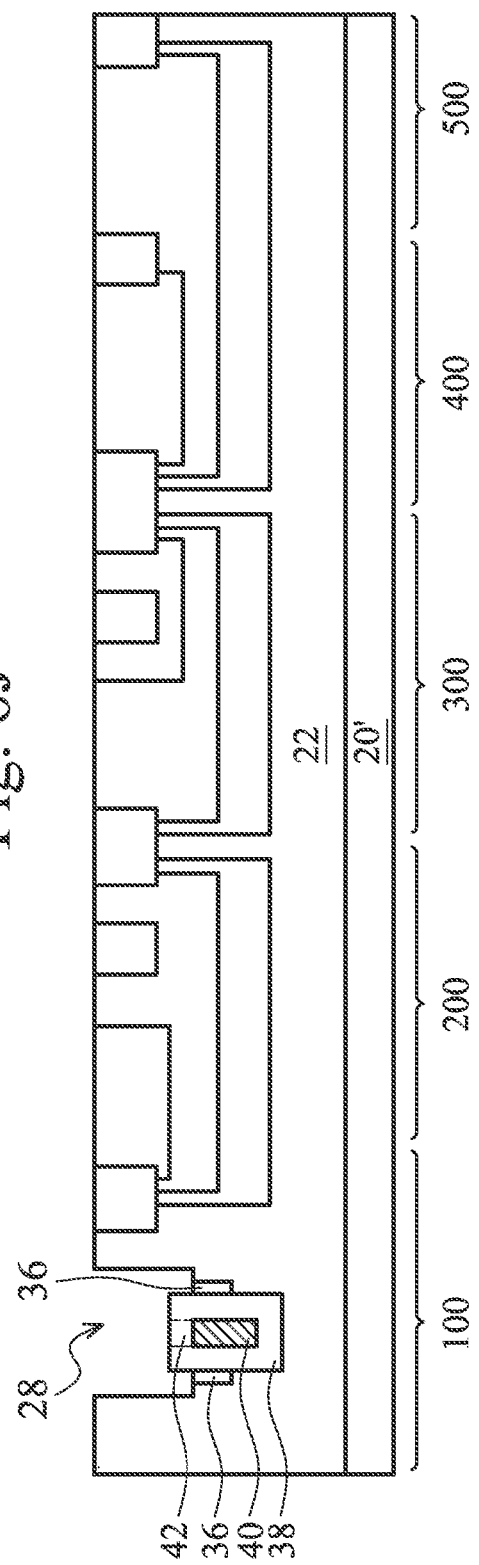

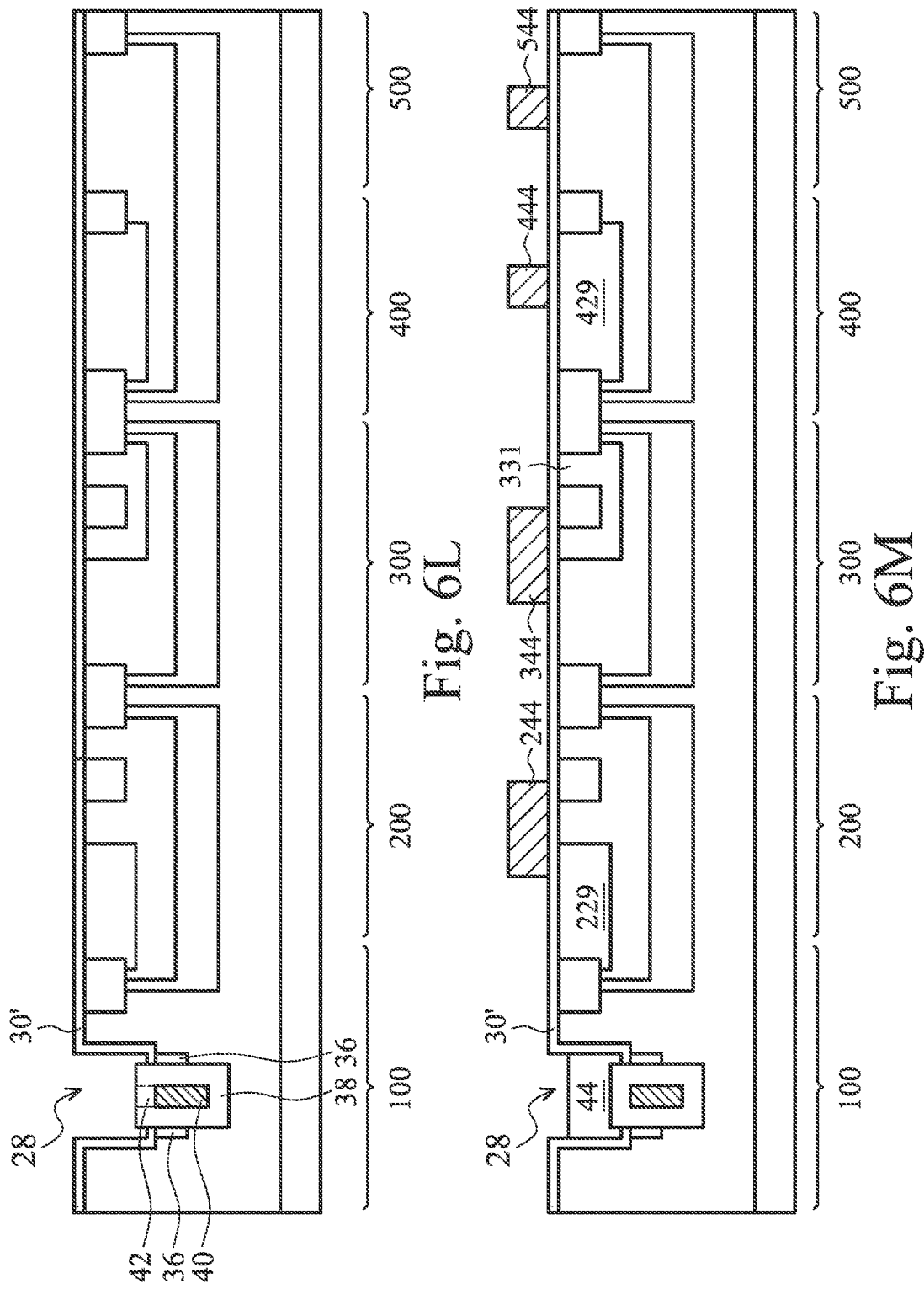

POWER MOSFET AND METHODS FOR FORMING THE SAME

This application is a continuation-in-part of U.S. patent application Ser. No. 13/486,681, filed Jun. 1, 2012, and entitled "Trench Power MOSFET," which application is hereby incorporated herein by reference.

BACKGROUND

In a conventional split-gate trench power Metal-Oxide-Semiconductor Field Effect Transistor (MOSFET), a polysilicon gate is divided into an upper part and a lower part, both formed in a trench. The upper part and the lower part are separated from each other by a dielectric layer. The upper part serves as the main gate for controlling the channel of the power MOSFET, and the lower part serves as the field plate for reducing surface electrical field. Accordingly, the depth of the main gate depends on the depth of the trench and the thickness of the dielectric layer filled in the recess. Both the depth of the trench and the thickness of the dielectric layer suffer from process variations, and are difficult to control.

The power MOSFET includes a p-body, in which the channel of the power MOSFET is formed to connect a source region over the p-body and a drain region under the p-body. To ensure that an entirety of the channel can be controlled by the main gate, an n-type epitaxy layer that is under the p-body needs to have at least a portion at a same level as the main gate. Since the depth of the main gate is difficult to control, a large process window is required to ensure that the epitaxy region has at least a portion at a same level as the main gate. The large process window, however, means that the gate-to-drain overlap is also large, the gate-to-drain capacitance is in turn large, and the variation of the gate-to-drain capacitance is also large. This results in the degradation in the performance of the power MOSFET and the large variation in the performance of the power MOSFET.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 1J are cross-sectional views of intermediate stages in the manufacturing of a trench power Metal-Oxide-Semiconductor Field Effect Transistor (MOSFET) in accordance with some exemplary embodiments;

FIGS. 3A through 3H are cross-sectional views of intermediate stages in the manufacturing of a trench power MOSFET in accordance with yet alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A trench power Metal-oxide-Semiconductor Field Effect Transistor (MOSFET) and the method of forming the same are provided in accordance with various exemplary embodiments. The intermediate stages of forming the trench power MOSFET are illustrated. The variations of the embodiments are discussed. Throughout the various views and illustrative embodiments, like reference numbers are used to designate like elements.

Figure 1B:
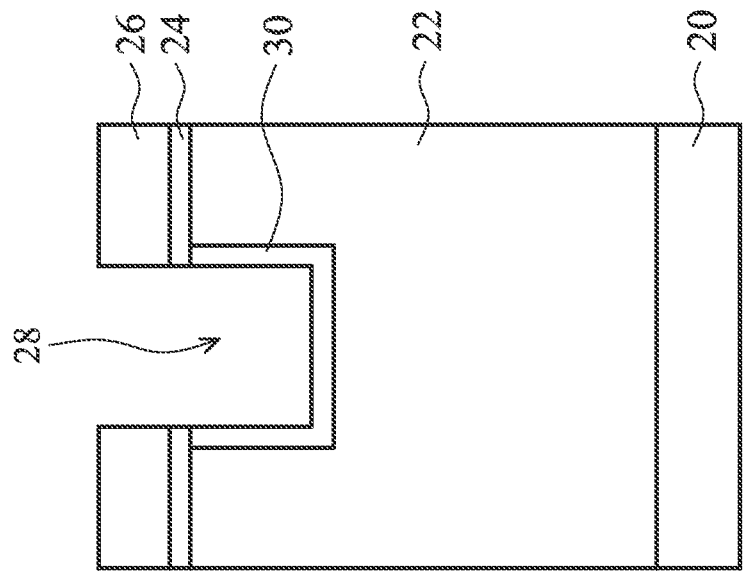
Figure 1A:
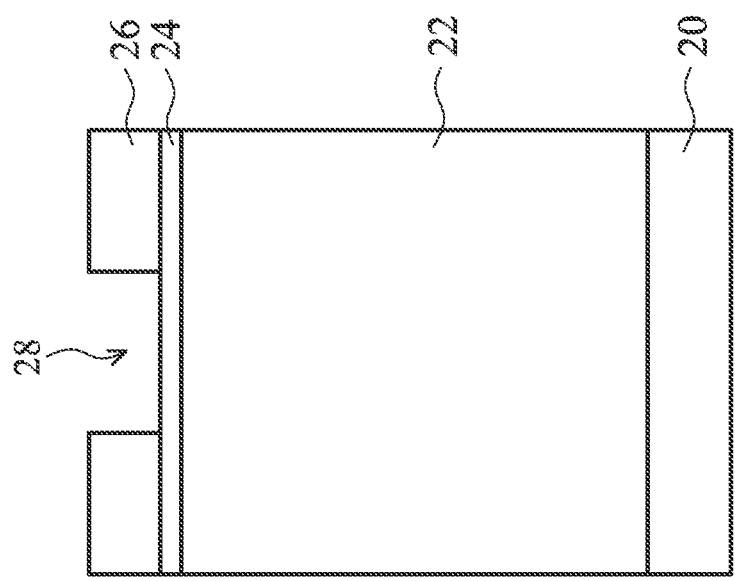

FIGS. 1A through 1J are cross-sectional views of intermediate stages in the formation of an n-type trench power MOSFET. Referring to FIG. 1A, semiconductor region 20, which is a portion of a semiconductor substrate, is provided. Semiconductor region 20 and the respective semiconductor substrate may have a crystalline silicon structure. Alternatively, semiconductor region 20 and the respective semiconductor substrate may be formed of other semiconductor materials such as silicon germanium. The semiconductor substrate may be a bulk substrate. In some embodiments, semiconductor region 20 is a heavily doped layer doped with an n-type impurity such as phosphorous or arsenic, for example, to an impurity concentration between about $10^{19}/cm^3$ and about $10^{21}/cm^3$. In the described embodiments, the term "heavily doped" means an impurity concentration of above about $10^{19}/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

Over heavily doped semiconductor region 20, epitaxy layer 22 is formed through epitaxy, and is lightly doped with an n-type impurity. The impurity concentration of epitaxy layer 22 may be between about $10^{15}/cm^3$ and about $10^{18}/cm^3$. Epitaxy layer 22 may be a crystalline silicon layer, although other semiconductor material may be used. Pad oxide layer 24 and hard mask 26 are then formed over epitaxy layer 22. In some embodiments, pad oxide layer 24 is formed by thermally oxidizing a top layer of epitaxy layer 22, and hence pad oxide layer 24 comprises silicon oxide. Hard mask layer 26 may be formed of silicon nitride, for example. Hard mask layer 26 is patterned to form trench 28 therein.

Next, as shown in FIG. 1B, pad oxide layer 24 and epitaxy layer 22 are etched using the patterned hard mask layer 26 as an etching mask, so that trench 28 extends into epitaxy layer 22. A further oxidation is then performed to form oxide layer 30 on the exposed surfaces of epitaxy layer 22, which exposed surfaces are in trench 28. Oxide layer 30 includes sidewall portions and a bottom portion. Next, referring to FIG. 1C, a further hard mask layer 32 is formed on oxide layer 30. Hard mask layer 32 may be formed using a conformal deposition method, and thickness T1 of the horizontal portion is close to the thickness T2 of the vertical portion of hard mask layer 32. Hard mask layer 32 includes sidewall portions on the sidewall portions of oxide layer 30, and a bottom portion on the bottom portion of oxide layer 30. In some exemplary embodiments, thickness T2 is between about 10 nm and about 1,000 nm. It is appreciated that the dimensions recited throughout the description are merely examples, and may be changed to different values.

Referring to FIG. 1D, the bottom portion of hard mask layer 32 is removed. A tilt implantation 34 is then performed to implant an n-type impurity into epitaxy layer 22, so that N-type Doped Drain (NDD) region 36 is formed in epitaxy layer 22. The NDD region 36 is self-aligned to the hard mask layer 32. The implanted n-type impurity may include phosphorous and/or arsenic. Tilt implantation 34 may include two tilt implantations that tilt to opposite directions. NDD region 36 laterally extends beyond the edges of hard mask layer 32 by distance T3. In some exemplary embodiments, distance T3 is between about 10 nm and about 1,000 nm, although distance T3 may be greater or smaller. The n-type impurity concentration of NDD regions 36 may be between about $10^{15}/cm^3$ and about $10^{18}/cm^3$. Furthermore, the ratio of the n-type impurity concentration in NDD regions 36 to the n-type impurity concentration of epitaxy region 22 may be greater than about 2 orders (100 times).

Figure 1F:
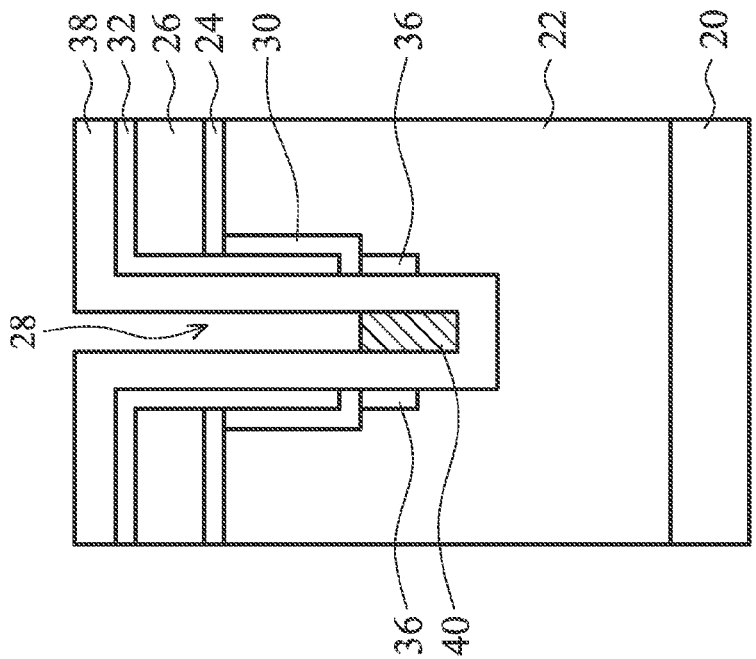
Figure 1E:
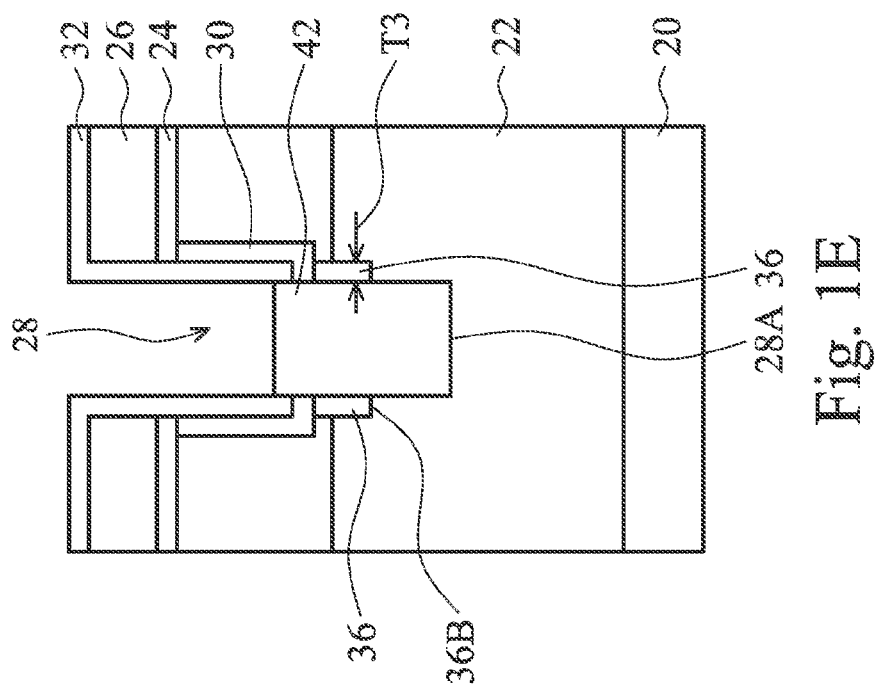

Next, referring to FIG. 1E, an etching step is performed to etch the bottom portion of oxide layer 30 and the underlying portion of epitaxy layer 22, so that trench 28 extends down into epitaxy layer 22. The bottom surface 28A of trench 28 may be lower than the bottom surface 36B of NDD regions 36 in accordance with some embodiments. The etch step is performed using hard mask layer 32 as an etching mask. The etching may be substantially anisotropic, and some portions of NDD region 36 are left on opposite sides of trench 28.

FIG. 1F illustrates the deposition for forming dielectric layer 38. In some embodiments, dielectric layer 38 comprises silicon oxide, although other dielectric materials that are suitable for forming gate dielectrics may also be used. Dielectric layer 38 comprises a portion at the bottom of trench 28, and sidewall portions on the sidewalls of trench 28. Dielectric layer 38 may be formed using a conformal deposition method. After the formation of dielectric layer 38, a portion of trench 28 is not filled.

As also illustrated in FIG. 1F, after the formation of dielectric layer 38, a conductive material is filled into trench 28, and is then etched back. In the etch-back step, a portion of the conductive material in trench 28 remains not etched, and the portion of the conductive material outside trench 28 is removed. The remaining portion of the conductive material forms field plate 40. In some embodiments, field plate 40 comprises polysilicon, although other conductive materials such as metals, metal silicides, or the like, may also be used.

Figure 1H:
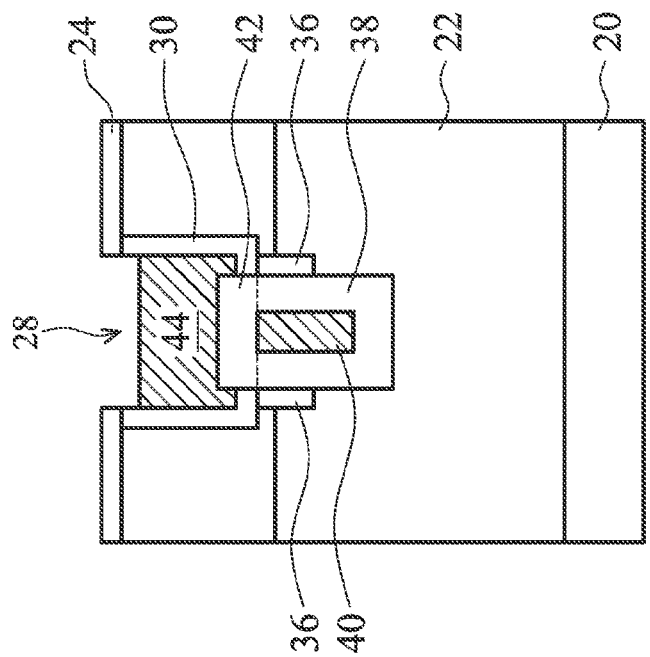
Figure 1G:
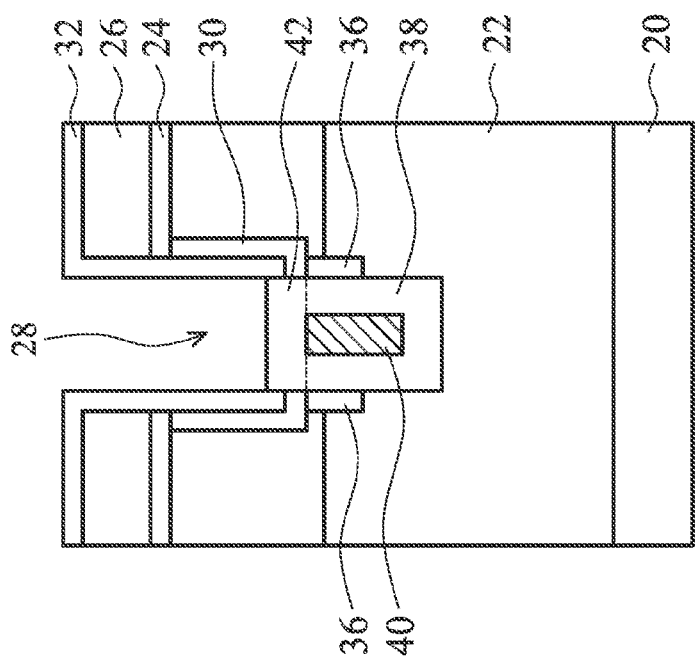

Referring to FIG. 1G, a further dielectric layer 42 is formed, and then etched back. Again, in the etch-back step, a portion of dielectric layer 42 in trench 28 remains, and the portion of dielectric layer 42 outside trench 28 is removed. Dielectric layer 42 is over field plate 40. Dielectric layer 42 may be formed of silicon oxide in some exemplary embodiments. Next, referring to FIG. 1H, hard mask layers 32 and 26 are removed, for example using diluted HF solution. Pad oxide layer 24, oxide layer 30, and dielectric layers 38 and 42, however, are not etched. Due to the removal of hard mask layer 32 from trench 28, trench 28 is expanded laterally, and pad oxide layer 24, oxide layer 30, and dielectric layer 42 are exposed.

Next, as also shown in FIG. 1H, an additional conductive material is filled into trench 28, and is then etched back. In the etch-back step, a portion of the conductive material in trench 28 remains, and the portion of the conductive material outside trench 28 is removed. The remaining portion of the conductive material forms main gate 44, which is separated from field plate 40 by dielectric layer 42.

In subsequent steps, as shown in FIG. 1I, an implantation is performed to form p-bodies 46 in a top layer of epitaxy layer 22. P-bodies 46 are formed on opposite sides of main gate 44. P-bodies 46 comprise a p-type impurity such as boron, indium, and/or the like. The bottoms 46A of p-bodies 46 are lower than the bottom surface 44A of main gate 44, and are higher than the bottom surfaces 36A of NDD regions 36. Accordingly, p-bodies 46 are in contact with the respective NDD regions 36. In some embodiments, p-bodies 46 have a p-type impurity concentration between about $10^{15}/cm^3$ and about $10^{18}/cm^3$. A further implantation is performed to form heavily doped n-type regions 48, which may have an n-type impurity concentration between about $10^{19}/cm^3$ and about $10^{21}/cm^3$, for example. P-bodies 46 include upper portions 46B that are level with main gate 44, and lower portions 46C that are level with, and contacting NDD regions 36.

Next, referring to FIG. 1J, Inter-Layer Dielectric (ILD) 50 is formed over the structure shown in FIG. 1I, and is formed over main gate 44. ILD 50 may comprise Phospho-Silicate glass (PSG), Boro-Silicate Glass (BSG), Boron-Doped Phospho-Silicate Glass (BPSG), Tetraethyl Orthosilicate (TEOS) oxide, or the like. ILD 50 may be formed as a blanket layer. Contact openings (filled with source regions 54 in FIG. 1J) are then formed by etching ILD 50 and some portions of heavily doped n-type regions 48. After the contact opening formation, the sidewalls of heavily doped n-type regions 48 are exposed, and the top surfaces of p-bodies 46 are also exposed.

Next, as also shown in FIG. 1J, an implantation is performed to dope a p-type impurity into the contact openings and into p-bodies 46, so that heavily doped p-type regions 52 are formed in the surface regions of p-bodies 46. Heavily doped p-type regions 52 act as the pickup regions of p-bodies 46. Next, a conductive material is deposited to form source region 54. Furthermore, a conductive material is deposited on heavily doped semiconductor region 20 to form drain region 56. Source region 54 and drain region 56 may also be deposited on the opposite surfaces of the respective wafer/die. In some embodiments, source region 54 and drain region 56 are formed of a metal or a metal alloy such as aluminum, copper, tungsten, nickel, and/or the like. Power MOSFET 60 is thus formed. The electrical connections to main gate 44 and field plate 40 may be formed by forming contact plugs, which contact plugs are not in the plane shown in FIG. 1J, and hence are not shown. In some embodiments, field plate 40 is electrically coupled to, and at a same voltage as, source region 54. In alternative embodiments, field plate 40 is disconnected from source region 54, and is applied with a voltage separate from the voltage of source region 54.

An on-current of power MOSFET 60 is schematically illustrated using curved lines 61, which pass through source region 54, heavily doped n-type regions 48, channel regions 46' in p-type bodies 46, NDD regions 36, epitaxy layer 22, and semiconductor region 20, and reach drain region 56.

It is observed that main gate 44 and NDD regions 36 have overlaps, the width of the overlapped area is affected by thickness T3 of NDD regions 36. The overlap width and the overlap width variation are both small. Accordingly, since NDD regions 36 form parts of the drain region of power MOSFET 60, the gate-to-drain capacitance is small. It is observed that the overlap width is substantially not affected by the process variation in the depth of various feature formed in the steps shown in FIGS. 1E through 1H.

Figure 2A:
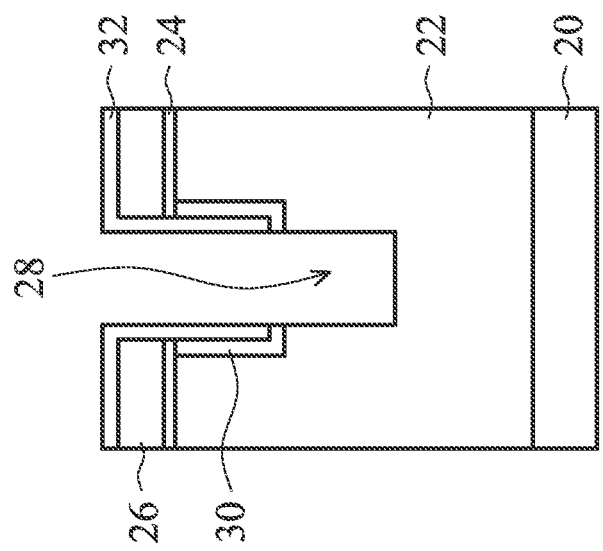
FIGS. 2A and 2B are cross-sectional views of intermediate stages in the manufacturing of a trench power MOSFET in accordance with alternative embodiments.
Figure 2B:
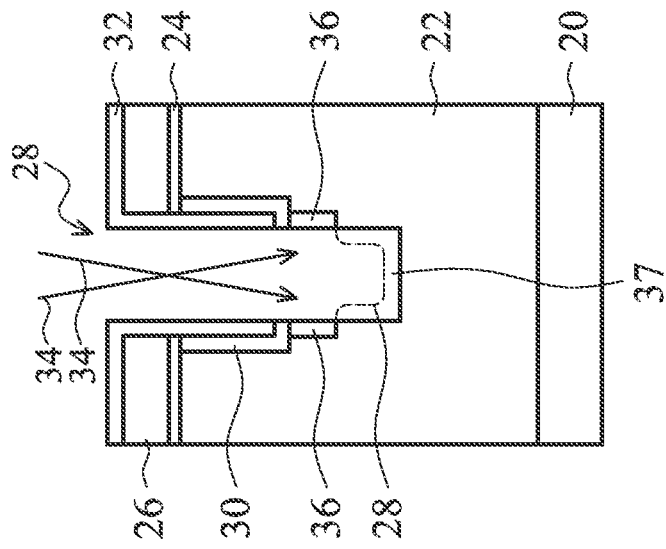

FIGS. 2A and 2B illustrate cross-sectional views of intermediate stages in the formation of a power MOSFET in accordance with alternative embodiments. Unless specified otherwise, the materials and formation methods of the components in these embodiments and the embodiments in FIGS. 3A through 3H are essentially the same as the like components, which are denoted by like reference numerals in the embodiments shown in FIGS. 1A through 1J. The details of the like components shown in FIGS. 2A through 3H may thus be found in the discussion of the embodiment shown in FIGS. 1A through 1J.

The initial steps of these embodiments are essentially the same as shown in FIGS. 1A through 1C. Next, as shown in FIG. 2A, an etch step is performed to remove the bottom portion of hard mask layer 32, and extend trench 28 into epitaxy layer 22. The etching may be anisotropic, and the remaining hard mask layer 32 is used as the etching mask, which covers edge portions of trench 28, and leaves the center region of trench 28 not covered. Next, as shown in FIG. 2B, NDD regions 36 are formed by tilt implantation 34. In some embodiments, to form NDD regions 36, mask region 37 may be formed at the bottom of trench 28, so that the bottom surface of NDD regions 36 is higher than the bottom of trench 28. Mask region 37 is then removed. In alternative embodiments, mask region 37 is not formed, and a proper implantation angle is used such that the bottom surface of NDD regions 36 is higher than the bottom of trench 28. The NDD region 36 is self-aligned to the hard mask layer 32. Subsequent steps in these embodiments are essentially the same as what are shown in FIGS. 1F through 1J, and are not repeated herein.

Figure 3D:
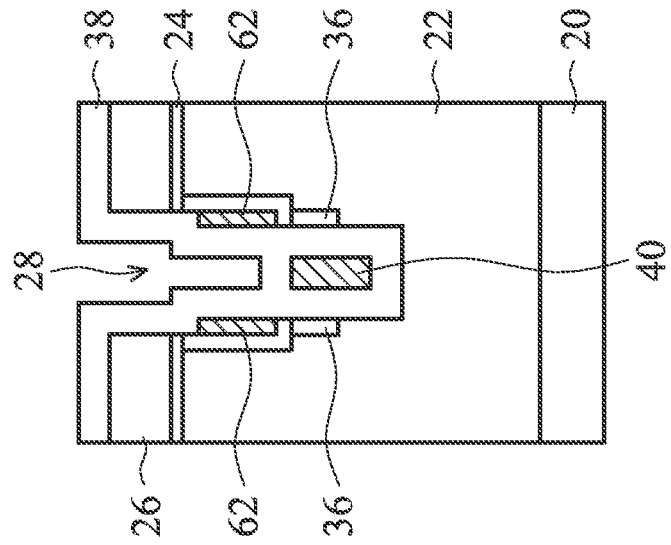

FIGS. 3A through 3H illustrate cross-sectional views of intermediate stages in the formation of a trench power MOSFET in accordance with yet alternative embodiments. The initial steps of these embodiments are essentially the same as shown in FIGS. 1A and 1B. Next, as shown in FIG. 3A, conductive layer 62 is formed. In some embodiments, conductive layer 62 is formed of polysilicon, and is referred to as polysilicon layer 62 hereinafter, although other conductive material such as metals, metal alloys, metal silicides, and the like, may also be used.

Referring to FIG. 3B, polysilicon layer 62 is etched. The horizontal portions of polysilicon layer 62 are removed, and some vertical portions of polysilicon layer 62 remain in trench 28. Next, the remaining portions of polysilicon layer 62 are used as a mask to etch oxide layer 30 and the underlying portion of epitaxy layer 22. Trench 28 thus extends into epitaxy layer 22.

Figure 3C:
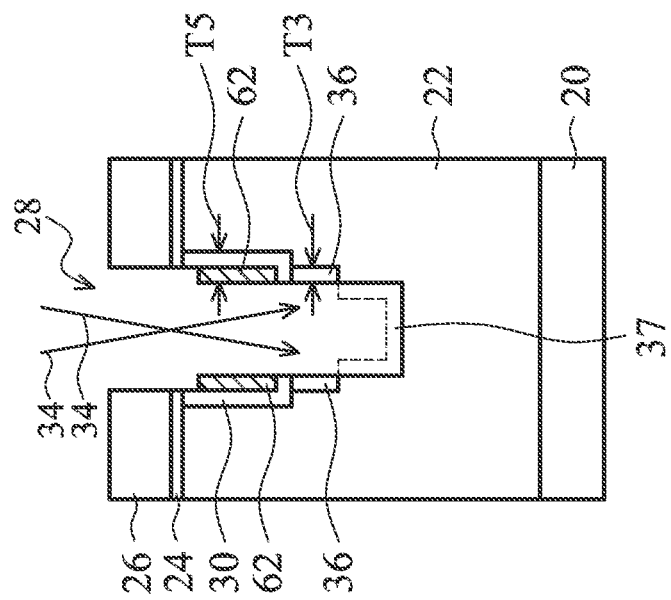

Referring to FIG. 3C, NDD regions 36 are formed through the tilt implantations of an n-type impurity. In some embodiments, to form NDD regions 36, mask region 37 may be formed at the bottom of trench 28, so that the bottom surface of NDD regions 36 may be higher than the bottom of trench 28. In alternative embodiments, mask region 37 is not formed, and a proper implantation angle is used such that the bottom surface of NDD regions 36 is higher than the bottom of trench 28. The NDD region 36 is self-aligned to the hard mask layer 32. It is observed that remain portions of polysilicon layer 62 overlap NDD regions 36, wherein the overlap width is close to the smaller one of thickness T5 of polysilicon layer 62 and thickness T3 of NDD regions 36. In FIG. 3D, dielectric layer 38 is formed, followed by the formation of field plate 40 at the bottom of trench 28. The formation of field plate 40 comprises a deposition step and an etch-back step. In FIG. 3E, dielectric layer 38 is etched back, and dielectric layer 42 is formed to cover field plate 40.

Figure 3F:
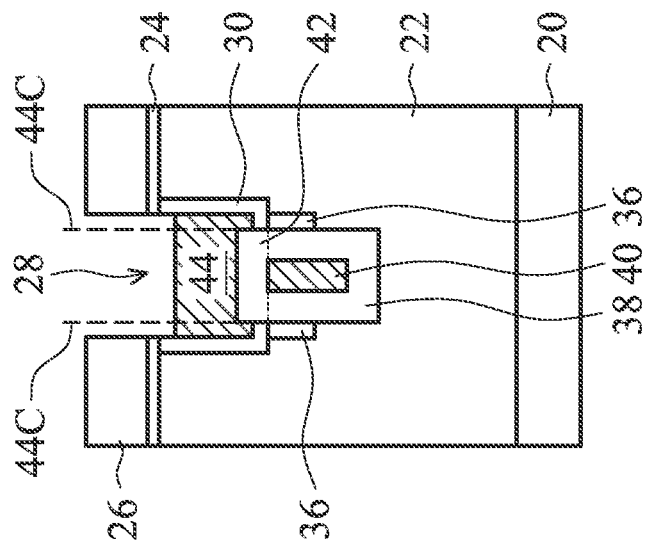
Figure 3E:
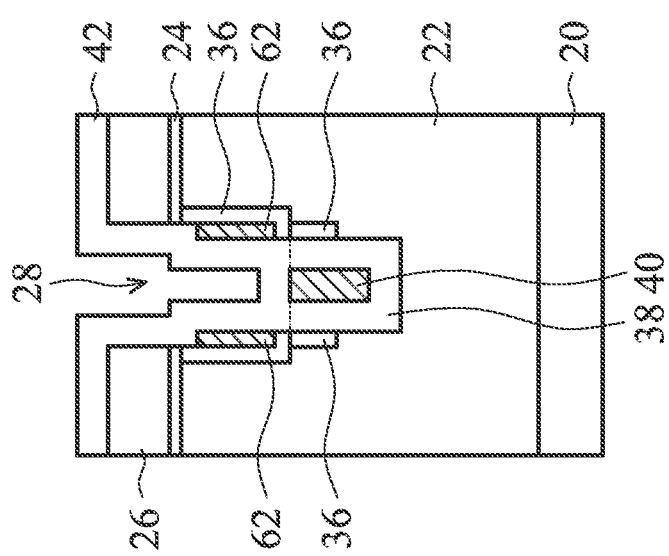

Next, in FIG. 3F, dielectric layer 42 is etched back so that the vertical portions of dielectric layer 42 on the sidewalls of trench 28 and the portions of dielectric layer 42 outside trench 28 are removed, while the portion over field plate 40 is left un-etched. A conductive material is then deposited, and then etched back. The portion of the conductive material in trench 28 is merged with the remaining portion of polysilicon layer 62 to form main gate 44. In some embodiments, the conductive material comprises polysilicon. It is appreciated that visible interface 44C may exist in main gate 44 since the two portions of main gate 44 are formed at different times. FIG. 3G illustrates the removal of hard mask layer 26. FIG. 3H illustrates the formation of p-bodies 46, heavily doped n-type regions 48, ILD 50, heavily doped p-type regions 52, source region 54, and drain region 56. The process details are not repeated herein.

Although the embodiments shown in FIGS. 1A through 3H provide methods of forming n-type power MOSFETs, the teaching is readily available for the formation of p-type power MOSFETs, with the conductivity types of the respective regions 20, 22, 36, 46, 48, and 52 inverted.

FIGS. 4A through 6O illustrate the process flows for integrating the formation of trench power MOSFET 60 with lateral MOS devices, wherein each of the lateral devices has a gate electrode over the top surface of epitaxy layer 22, and source/drain regions on the opposite sides of the gate electrode. Exemplary lateral MOS devices include, and are not limited to, High Voltage (HV) N-type MOS (HVNMOS) devices, Low Voltage (LV) N-type MOS (LVNMOS) devices, LV P-type MOS (LVPMOS) devices, and High Voltage (HV) P-type MOS (HVPMOS) devices. Unless specified otherwise, the materials and formation methods of the components in these embodiments are essentially the same as the like components, which are denoted by like reference numerals in the embodiments shown in FIGS. 1A through 3H. The details regarding the formation processes and the materials of the components shown in FIGS. 4A through 6O may thus be found in the discussion of the embodiments shown in FIGS. 1 through 3H.

FIG. 4A illustrates device regions 100, 200, 300, 400, and 500, which are a trench power MOSFET region, an HVNMOS region, an HVPMOS region, an LVNMOS region, and an LVPMOS region, respectively. Substrate 20 is provided, and includes portions in device regions 100, 200, 300, 400, and 500. In accordance with some embodiments, substrate 20 is a p-type substrate, although it may also be an n-type substrate in accordance with alternative embodiments. N-type Buried Layer (NBL) 110 is formed at the top surface of substrate 20, for example, through an implantation. NBL 110 may be in device region 100, and does not extend into device regions 200, 300, 400, and 500. Next, an epitaxy is performed to form epitaxy layer 22 over substrate 20, wherein epitaxy layer 22 may be in-situ doped with an n-type impurity during the epitaxy. After the epitaxy, isolation regions 23 are formed to extend from the top surface of epitaxy layer 22 into epitaxy layer 22. Isolation regions 23 may be Shallow Trench Isolation (STI) regions, and hence are referred to as STI regions 23 hereinafter, although they may also be field oxides. STI regions 23 may define the active regions for forming MOS devices therein.

Referring to FIG. 4B, pad oxide layer 24 is formed on the surface of epitaxy layer 22, and extends into device regions 100, 200, 300, 400, and 500. A plurality of implantations is performed to form a plurality of doped regions in epitaxy layer 22. In some embodiments, pad oxide layer 24 is formed before the implantation steps, wherein the implanted impurities penetrate through pad oxide layer 24 to form the doped regions.

Low Voltage Well (LVW) regions 229 and 429, which may be p-type regions, are formed in device regions 200 and 400, respectively. LVW regions 229 and 429 may be configured to support the respective device to operate at operation voltages that are around 5V. P-type Doped Drain (PDD) region 331 is formed in device region 300. High Voltage N-Well (HVNW) regions 225, 325 and 425 are formed in device regions 200, 300, and 400/500, respectively. The sign "400/500" indicates a combined region of regions 400 and 500. LVW regions 229 and 429 and PDD region 331 are formed inside HVNW regions 225, 425, and 325, respectively. LVW regions 229 and 429 may have a p-type doping concentration between about $10^{15}/cm^3$ and about $10^{18}/cm^3$, for example. PDD region 331 is lightly doped, and may have a p-type doping concentration between about $10^{15}/cm^3$ and about $10^{18}/cm^3$, for example.

Furthermore, deep p-well regions 227, 327, and 427 are formed in device regions 200, 300, and 400/500, respectively, and extend below HVNW regions 225, 325, and 425, respectively. HVNW regions 225, 325, and 425 and deep p-well regions 227, 327, and 427 may have doping concentrations between about $10^{14}/cm^3$ and about $10^{17}/cm^3$. The detailed formation processes, the respective photo resists, and the respective lithography masks for the plurality of implantation steps shown in FIG. 4B are not illustrated, and one skill in the art will realize the respective details when equipped with the teaching of the embodiments.

Figures 4C, 4D:
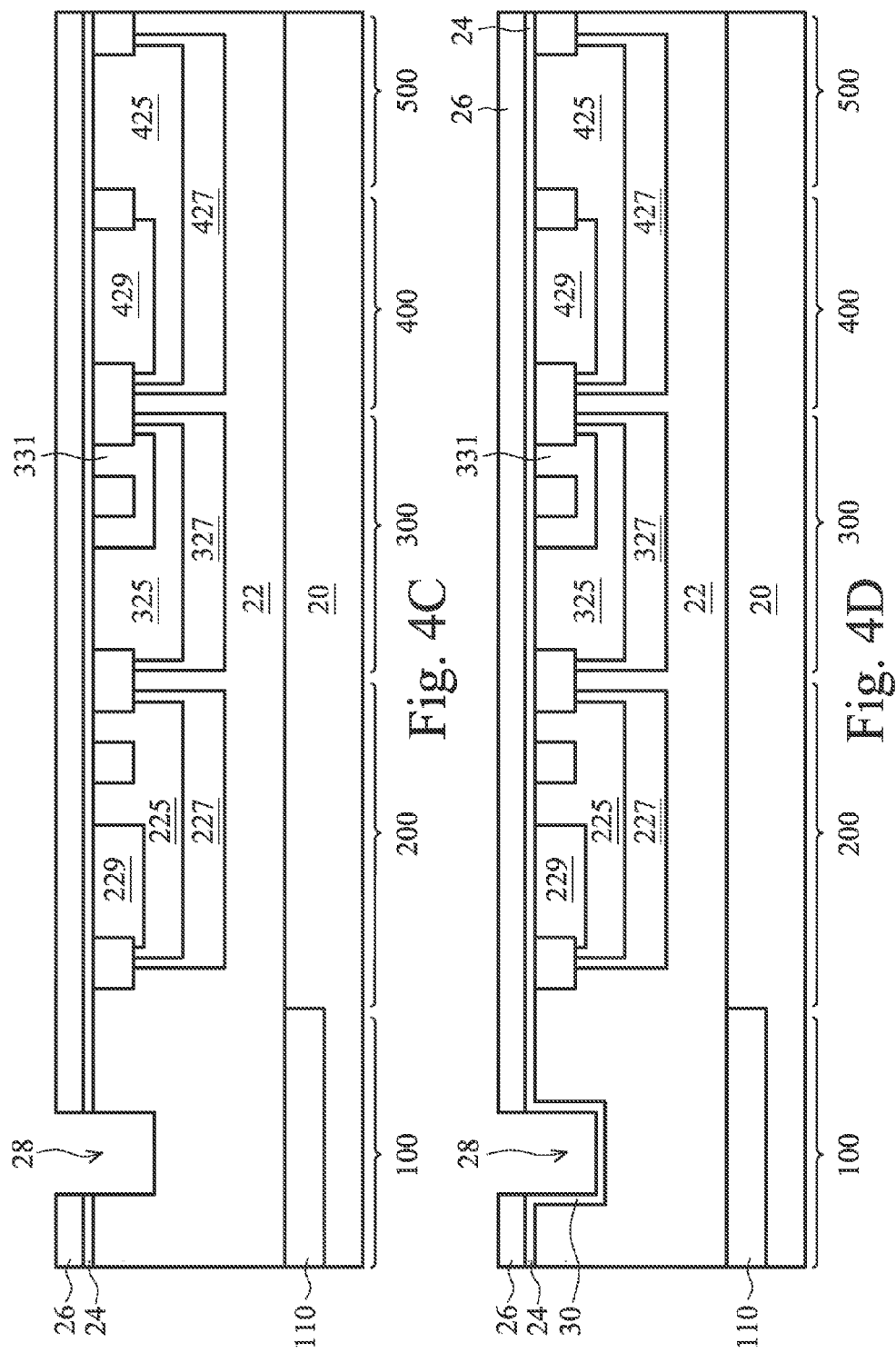
FIGS. 4A through 6O are cross-sectional views of intermediate stages in the integration of the formation of various MOS devices with the formation of the trench power MOSFET.

In FIG. 4C, hard mask layer 26 is formed over pad oxide layer 24, and is then patterned. Hard mask layer 26 extends into device regions 100, 200, 300, 400, and 500. Trench 28 is then formed in device region 100 using the patterned hard mask layer 26 as an etching mask. Next, as shown in FIG. 4D, oxide layer 30 is formed, for example, through a thermal oxidation of epitaxy layer 22. Oxide layer 30 thus covers sidewalls and the bottom of trench 28.

Figure 4E:
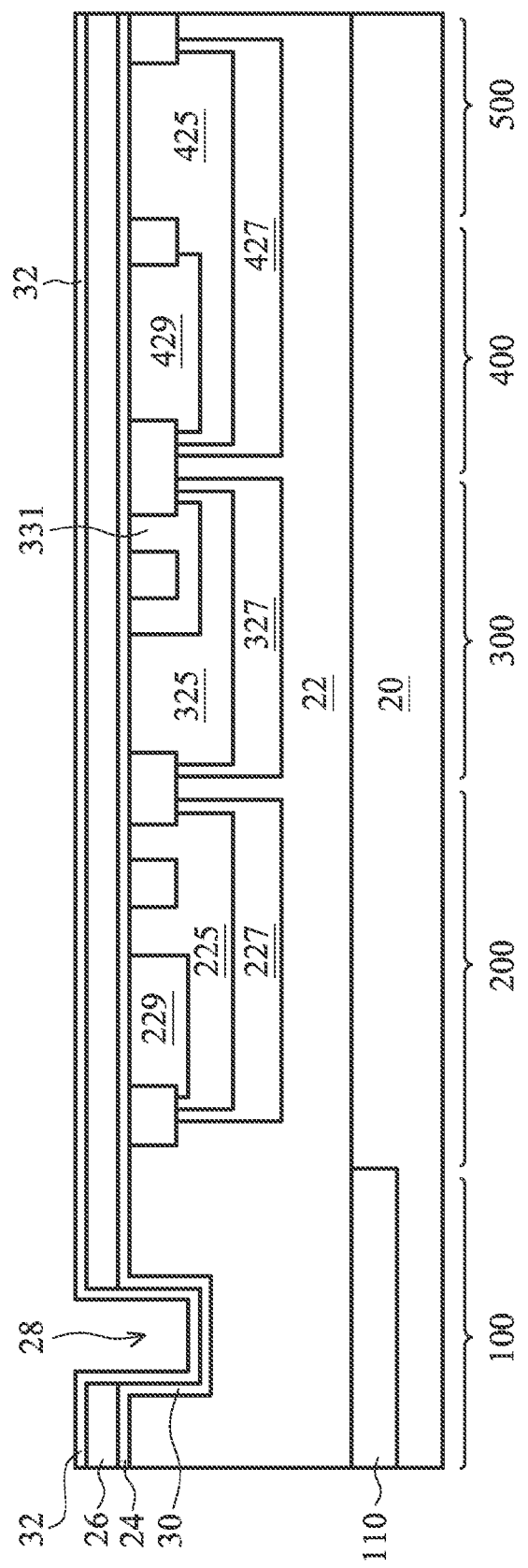
Figure 4F:
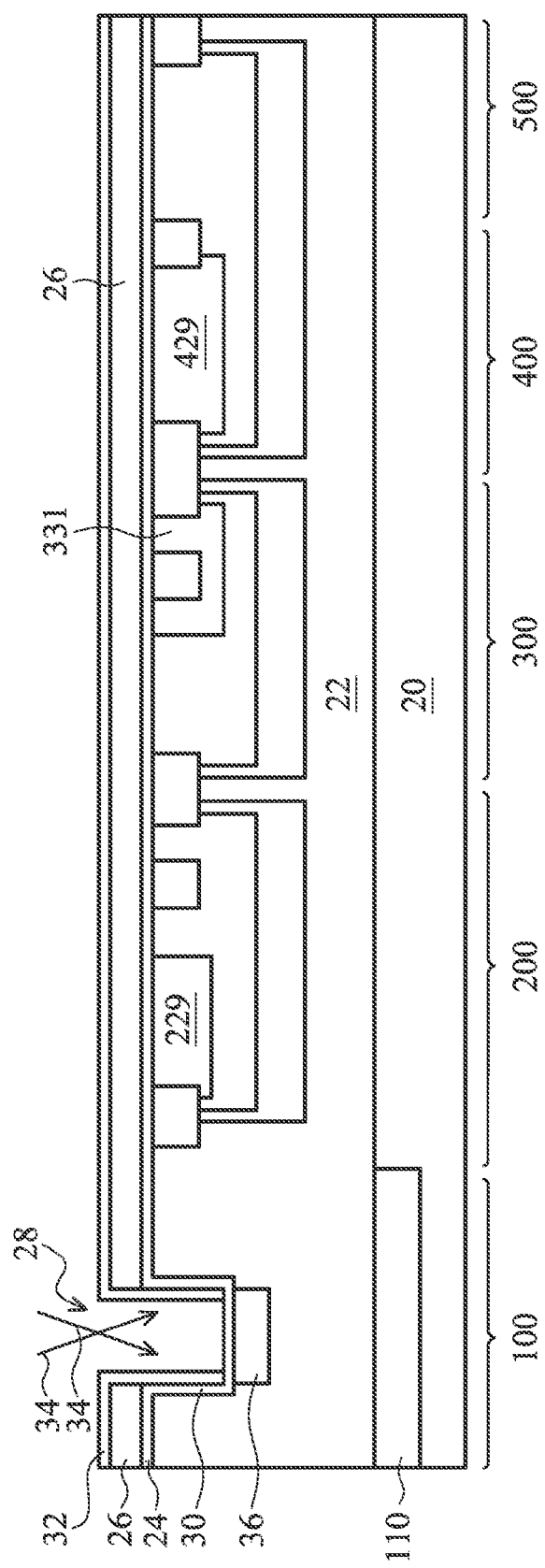

In FIG. 4E, hard mask layer 32 is formed, for example, in a conformal deposition step. Hard mask layer 32 includes portions on the sidewalls and the bottom of trench 28. The bottom portion of hard mask layer 32, which bottom portion is at the bottom of trench 28, is then removed, and the resulting structure is shown in FIG. 4F. Next, tilt implantations 34 are performed. As a result, NDD region 36 is formed in epitaxy layer 22, and below trench 28. Due to the tilt implantations, NDD region 36 extends laterally beyond the edges of trench 28.

Figure 4G:
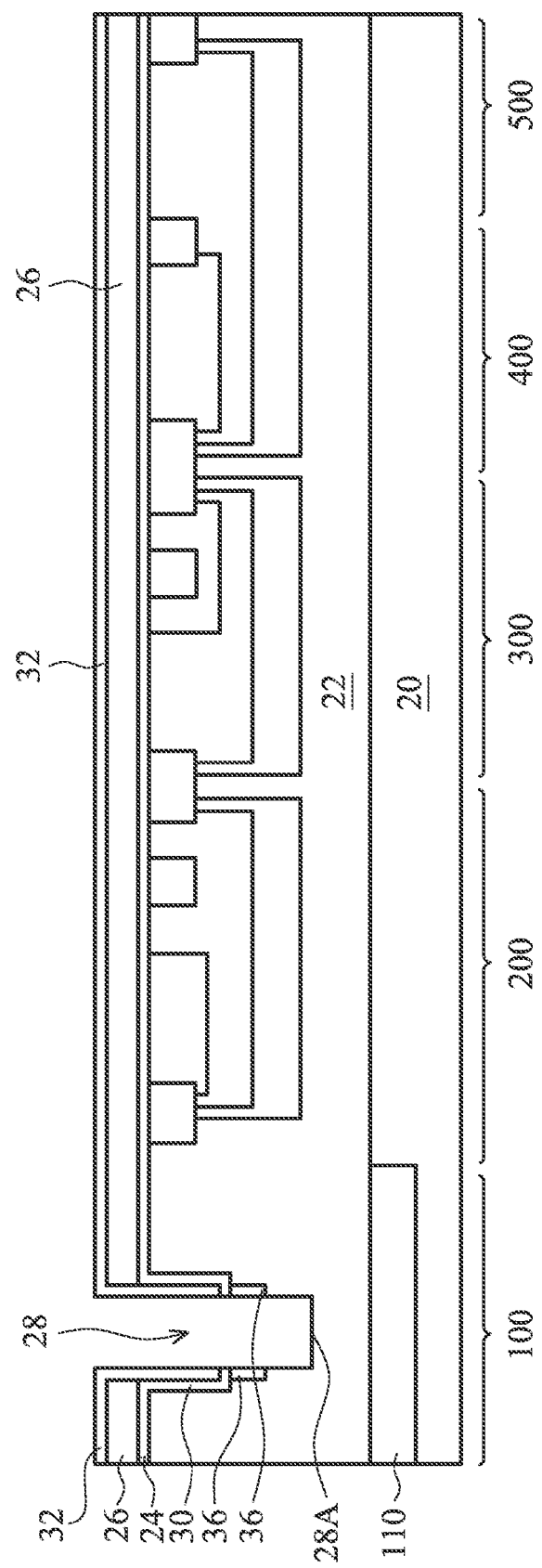
Figure 4H:
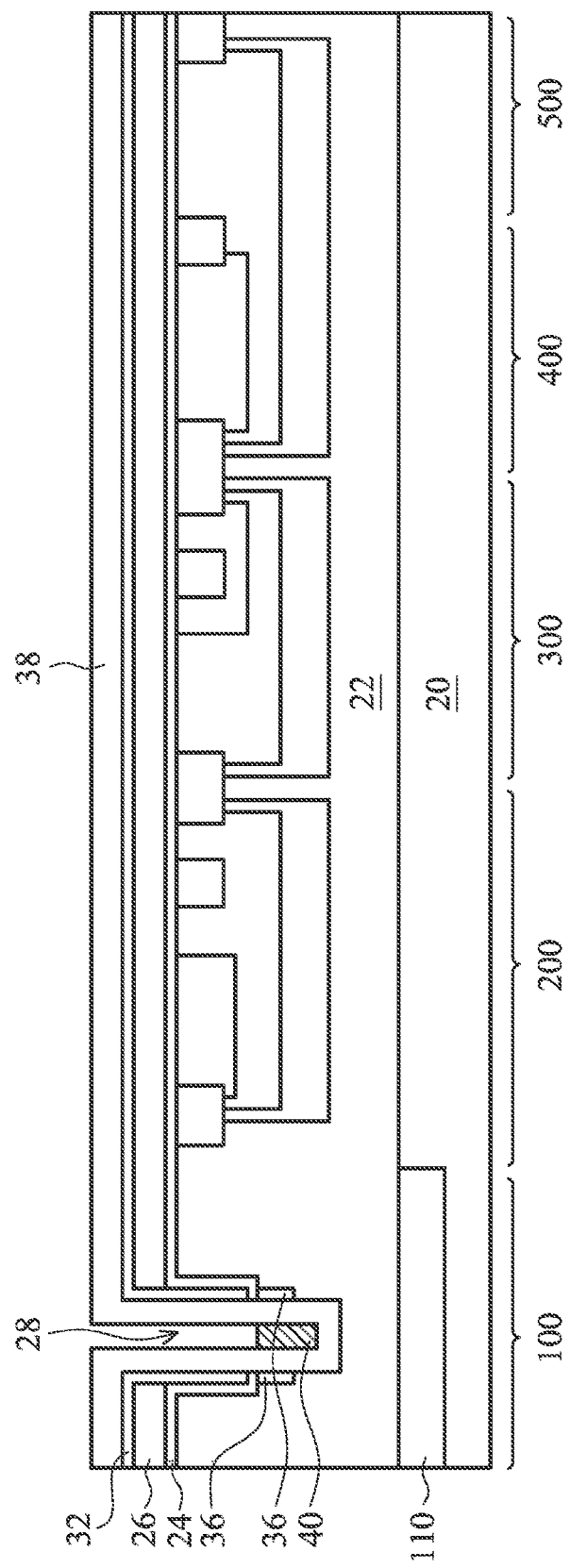

In FIG. 4G, the bottom portion of oxide layer 30 in trench 28 and the underlying epitaxy layer 22 are etched, so that trench 28 extends down into epitaxy layer 22. Trench 28 penetrates through NDD region 36. As a result, NDD region 36 has portions remaining on the opposite sides of trench 28. In FIG. 4H, dielectric layer 38, which may be a conformal layer, is formed, and extends into trench 28. A portion of trench 28 that is not filled with dielectric layer 38 is then filled with field plate 40, which occupies a lower portion of the remaining trench 28. An upper portion of trench 28 is not occupied by field plate 40.

Figure 4I:
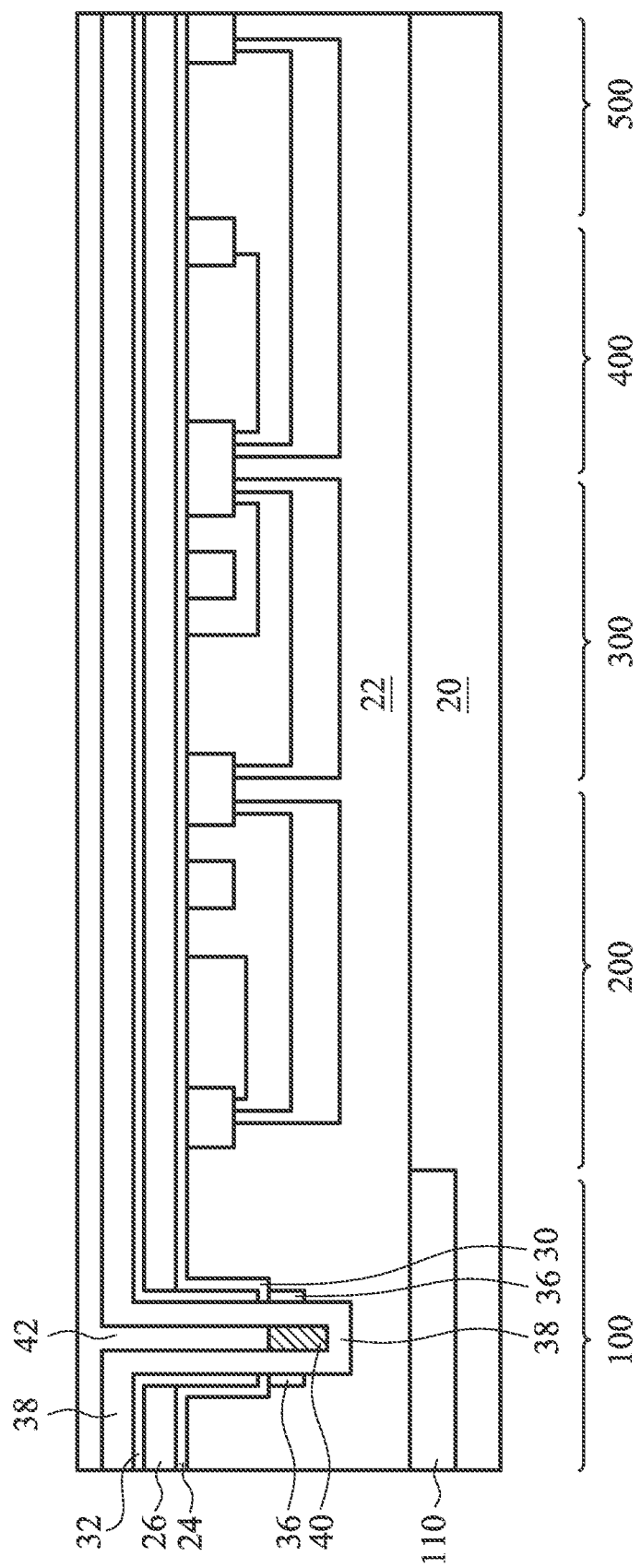
Figure 4J:
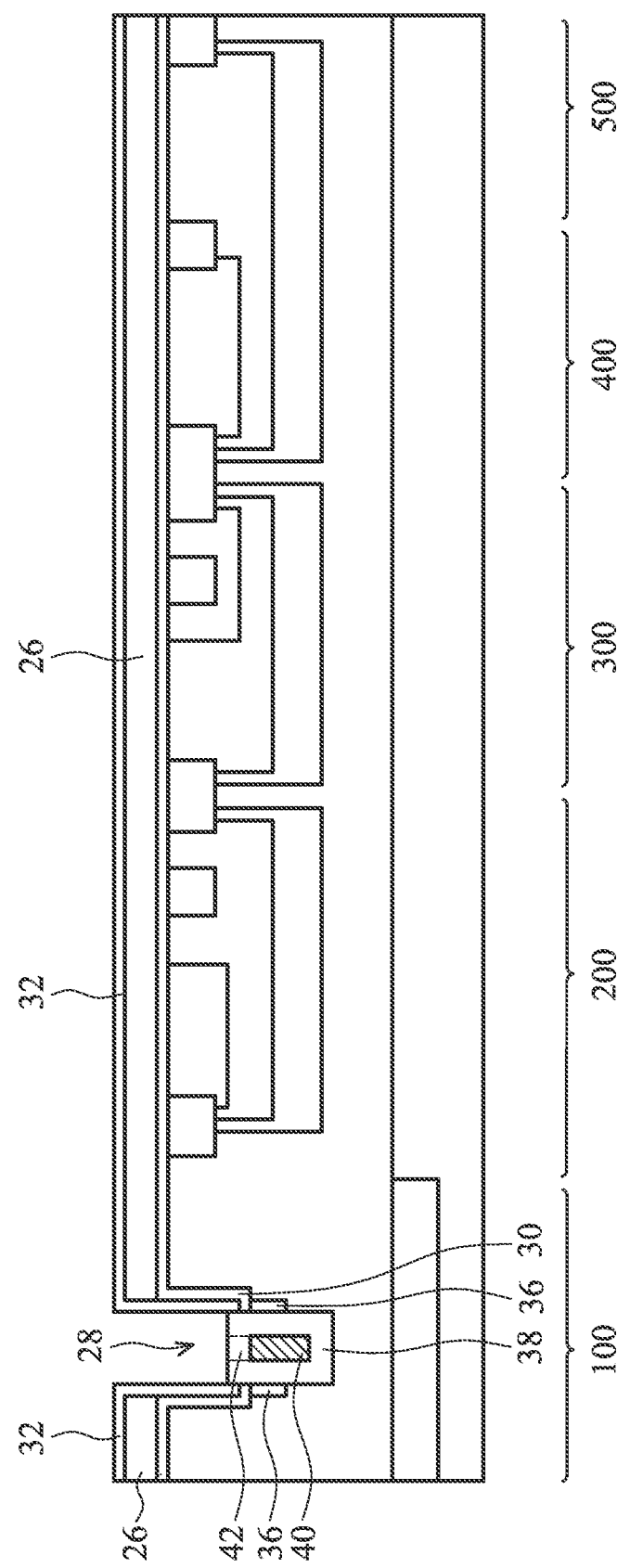

In FIG. 4I, dielectric layer 42 is deposited to fill trench 28. An etch back step is then performed to remove portions of dielectric layers 38 and 42, so that trench 28 reappears, as shown in FIG. 4J. A portion of dielectric layer 42 remains to cover field plate 40. In some embodiments, nitride layers 26 and 32 and oxide layers 24 and 30 are removed, and the resulting structure is shown in FIG. 4K. In FIG. 4L, gate dielectric layer 30' is formed, for example, through a thermal oxidation step and/or a deposition step.

Figure 4M:
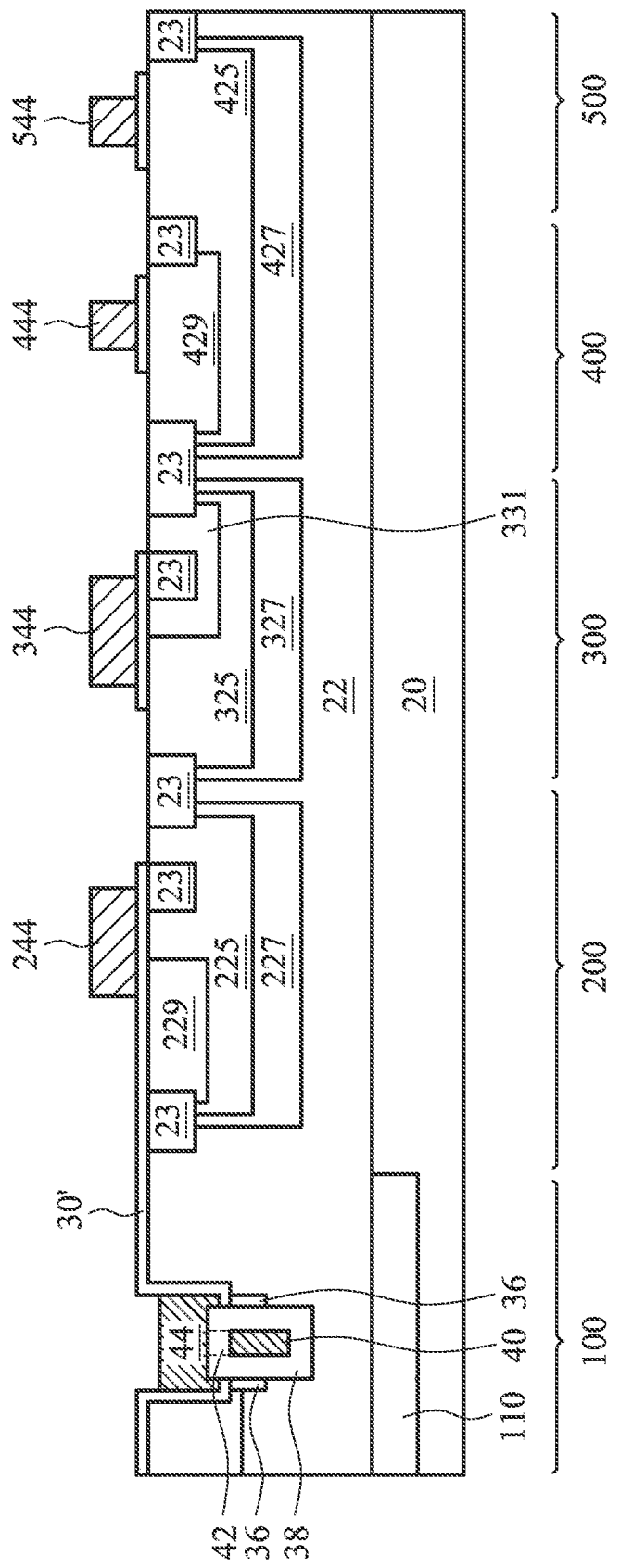

FIG. 4M illustrates the formation of main gate 44 in trench 28. In some embodiments, at the time main gate 44 is formed, gate electrodes 244, 344, 444, and 544 are formed in device regions 200, 300, 400, and 500, respectively. The formation of main gate 44 and gate electrodes 244, 344, 444, and 544 may include the deposition of a conductive material, and a patterning step. In alternative embodiments, main gate 44 is formed in a step different from the step for forming gate electrodes 244, 344, 444, and 544.

Figure 4N:
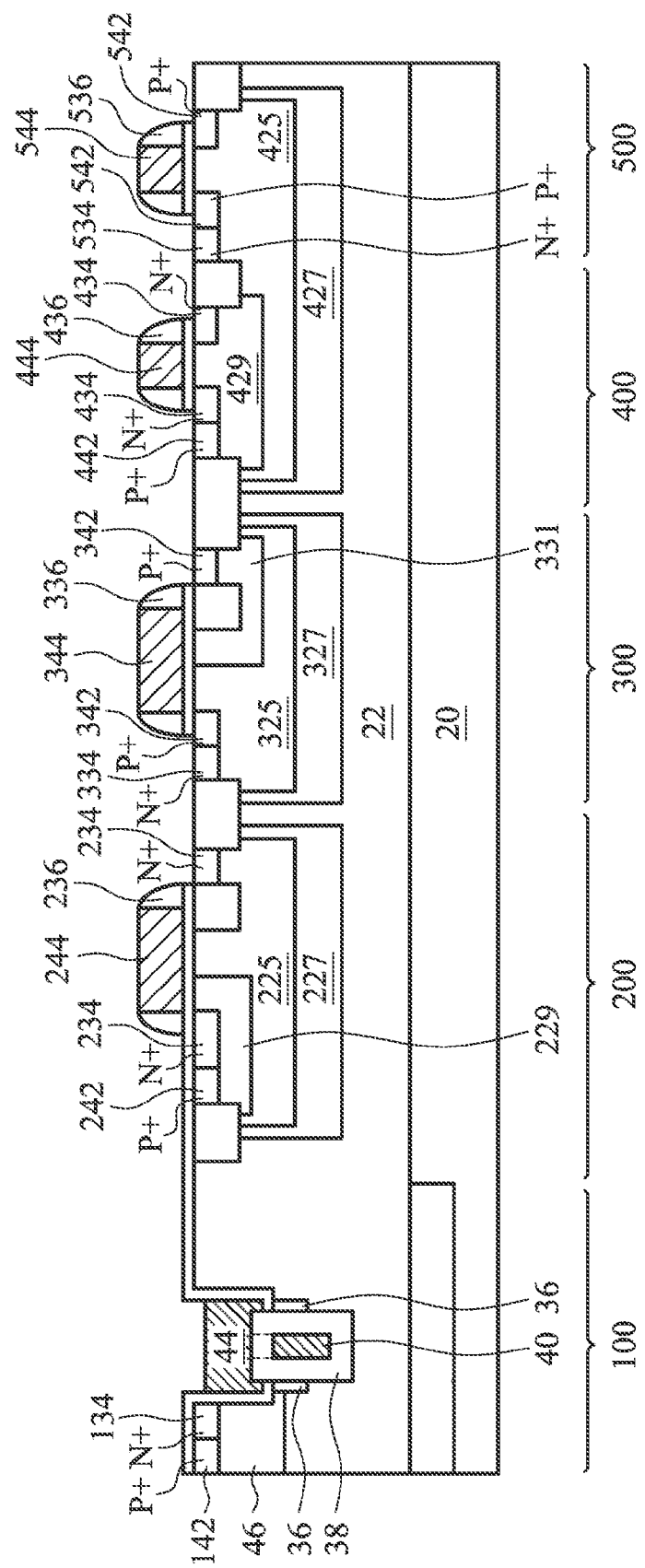

Referring to FIG. 4N, gate spacers 236, 336, 436, and 536 are formed simultaneously, and on the sidewalls of the respective gate electrodes 244, 344, 444, and 544. An implantation is then performed to implant epitaxy layer 22 in order to form heavily doped n-type regions (marked as N+ regions) 134, 234, 334, 434, and 534. An additional implantation is also performed to implant epitaxy layer 22 in order to form heavily doped p-type regions (marked as P+ regions) 142, 242, 342, 442, and 542. P-body 46 is also formed in epitaxy layer 22 through an implantation. P-body 46 includes an upper portion that is level with main gate 44 and a lower portion that is level with, and contacting, NDD region 36.

Figure 4O:
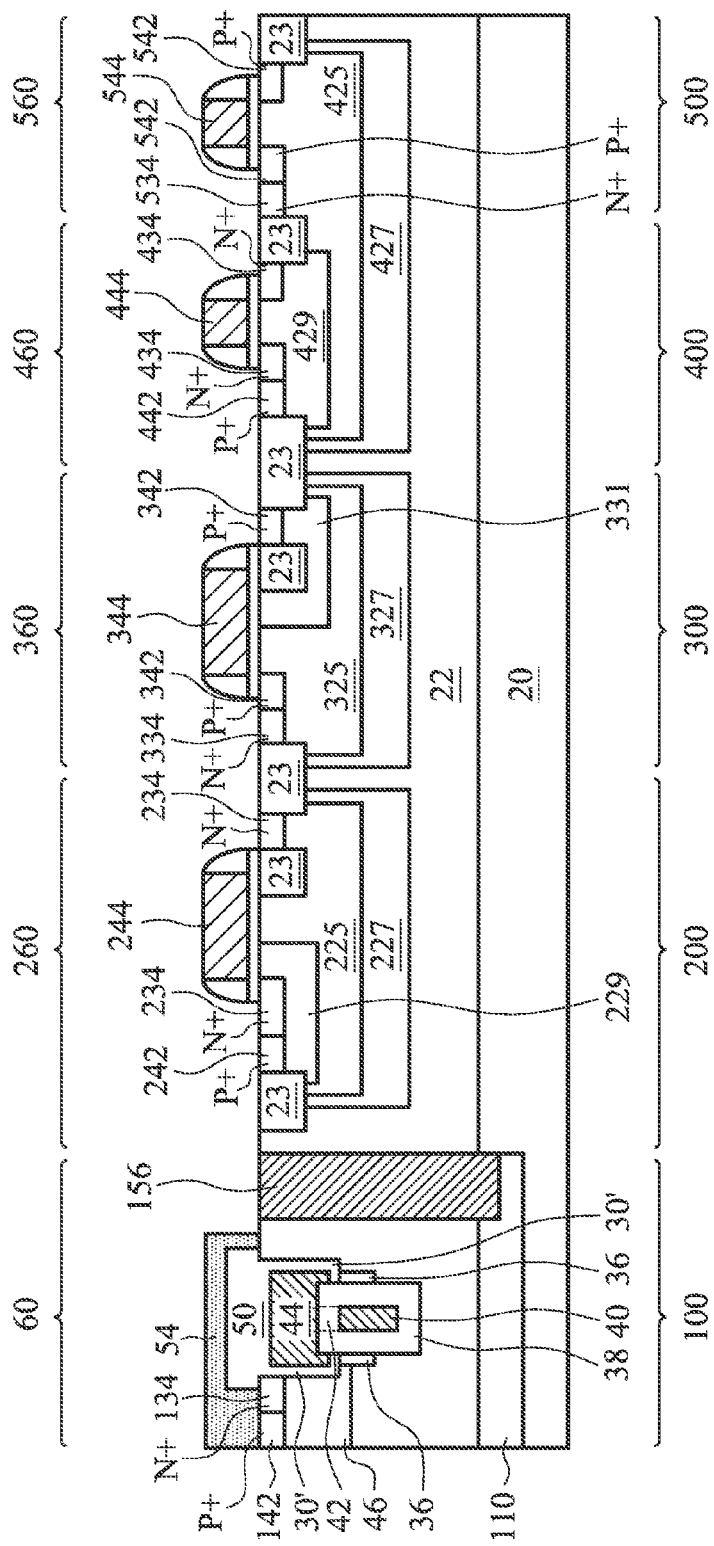

Referring to FIG. 4O, deep metal via 156 is formed to penetrate through epitaxy layer 22, and to contact NBL 110. The formation of deep metal via 156 may include etching epitaxy layer 22 to form an opening, and then filling the opening with a metallic material such as copper, aluminum, tungsten, or the like. Deep metal via 156 is electrically connected to NBL 110, which forms the drain region of trench power MOSFET 60. Source region 54 is then formed. The formation of MOS devices 60, 260, 360, 460, and 560 in device regions 100, 200, 300, 400, and 500, respectively, is thus finished.

In the resulting structure in FIG. 4O, HVNMOS device 260 and LVNMOS device 460 includes source regions 234 that are in LVW regions 229 and 429, respectively. Accordingly, the channel lengths of HVNMOS device 260 and LVNMOS device 460 may be adjusted by adjusting the positions of LVW regions 229 and 429 with relative to the respective overlying gate electrodes 244 and 444.

HVPMOS device 360 includes drain 342 (on the right side of gate electrode 332), which is spaced apart from gate electrode 344 by a portion of PDD region 331. Accordingly, HVPMOS device 360 may sustain a high drain voltage. LVPMOS device 560 includes source and drain regions 542 in HVNW region 425.

In the above-discussed process flow, at the same time various components of trench power MOSFET 60 is formed, the components of HVNMOS device 260, HVPMOS device 360, LVNMOS device 460, and LVPMOS device 560 are also formed. By forming the device components such as the implanted regions of MOS devices 60, 260, 360, 460, and 560 simultaneously, the lithography masks and the respective process steps may be shared, and the manufacturing cost may be saved.

FIGS. 5A through 5D illustrate the cross-sectional views of intermediate stages in the integration of HVNMOS device 260, HVPMOS device 360, LVNMOS device 460, and LVPMOS device 560 with the formation of trench power MOSFET 60 in accordance with alternative embodiments. In addition, HV Lateral N-type Fully-isolated (HVLNF) MOS device 660 (FIG. 5D) is also formed. These embodiments are similar to the embodiments in FIGS. 4A through 4O, except that instead of forming n-type epitaxy layer 22, a p-type epitaxy layer 22' is formed, and HNVW regions are formed in p-type epitaxy layer 22'. MOS devices 60, 260, 360, 460, and 560 are then formed at the surface of the HVNW regions.

Figure 5A:
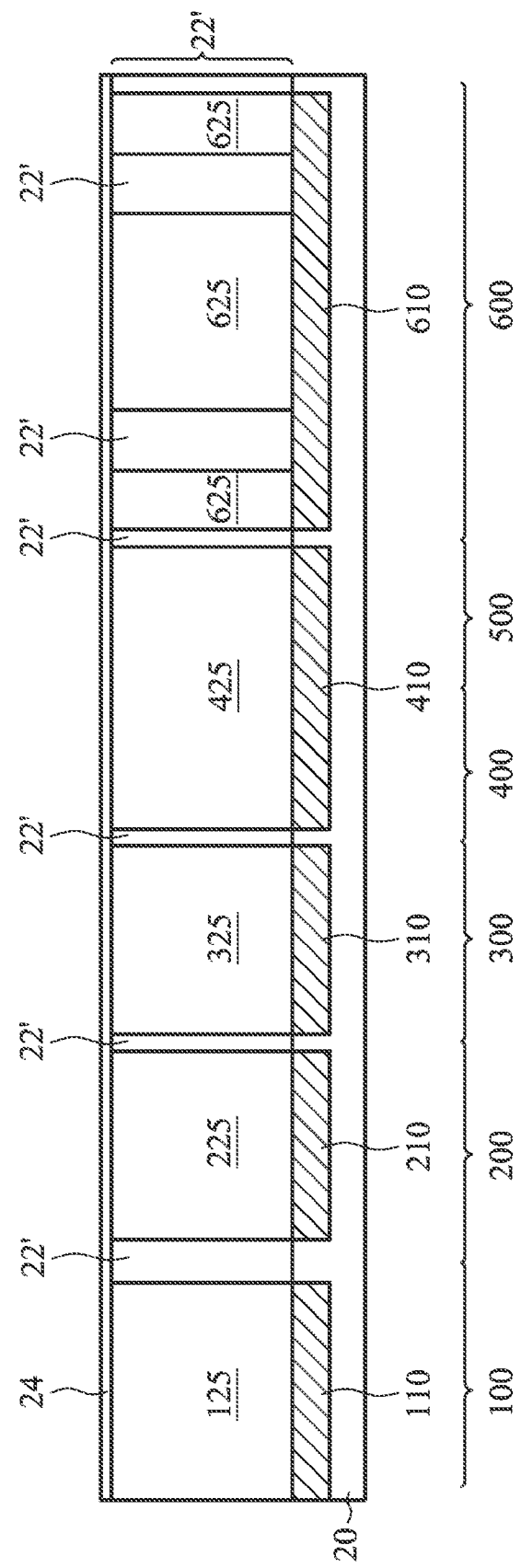

Referring to FIG. 5A, substrate 20 is provided, which may be a p-type substrate. NBLs 110, 210, 310, 410, and 610 are formed in device regions 100, 200, 300, 400/500, and 600 by implanting substrate 20. Next, epitaxy layer 22' is formed, wherein a p-type impurity is in-situ doped when epitaxy layer 22' is formed. Pad oxide layer 24 is then formed on epitaxy layer 22', for example, through a thermal oxidation.

Figure 5B:
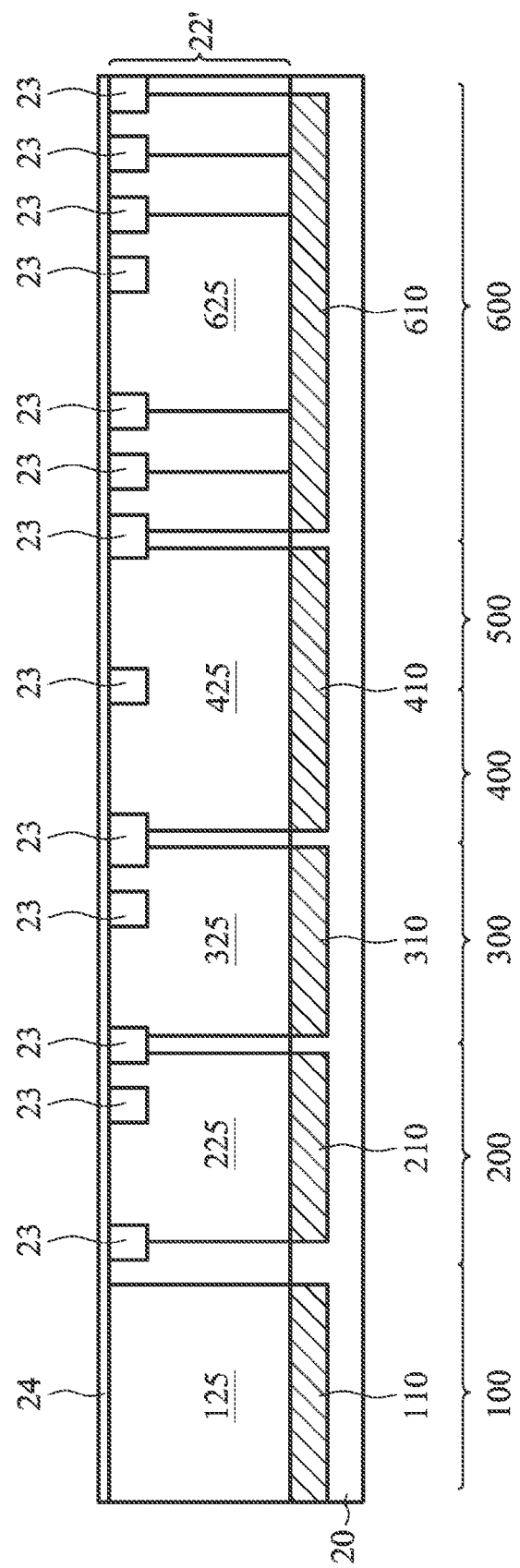

Referring to FIG. 5B, STI regions 23 are formed, and extend from the top surface into epitaxy layer 22'. Furthermore, HVNW regions 125, 225, 325, 425, and 625 are formed in device regions 100, 200, 300, 400/500, and 600, respectively, through the implantation of an n-type impurity. HVNW regions 125, 225, 325, 425, and 625 may extend from the top surface to the bottom surface of epitaxy layer 22', and may be joined to the underlying NBLs 110, 210, 310, 410, and 610, respectively. In some embodiments, the implanted impurities penetrate through pad oxide layer 24 to form the implantation regions.

Figure 5C:
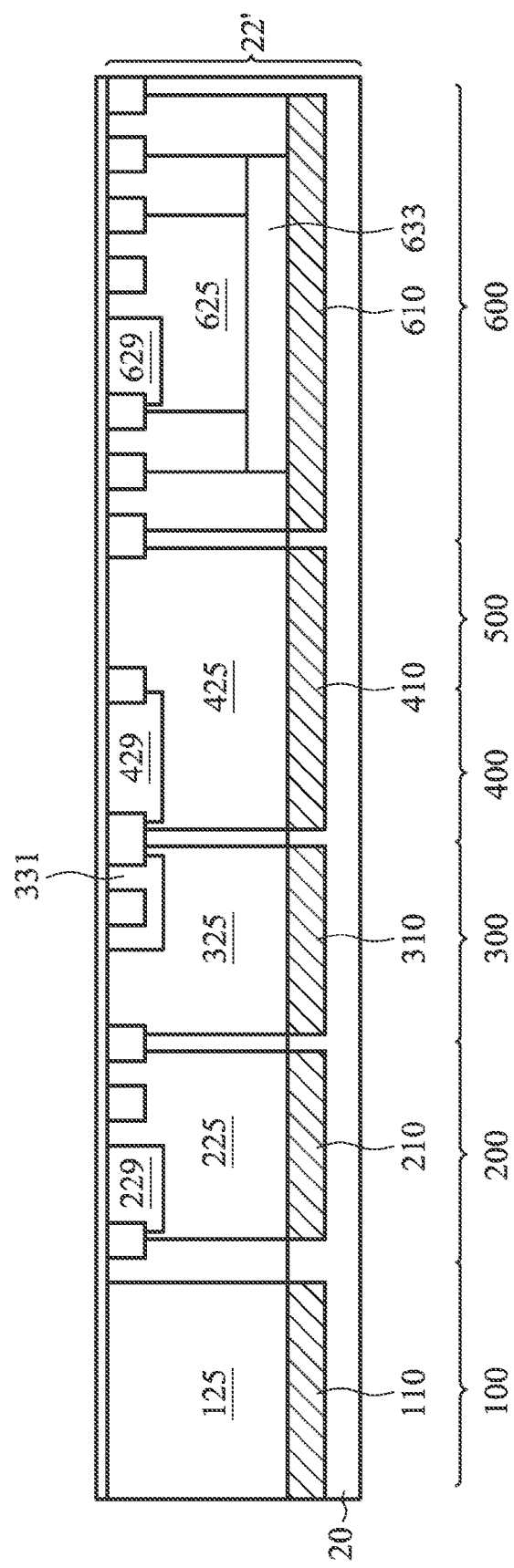
Figure 5D:
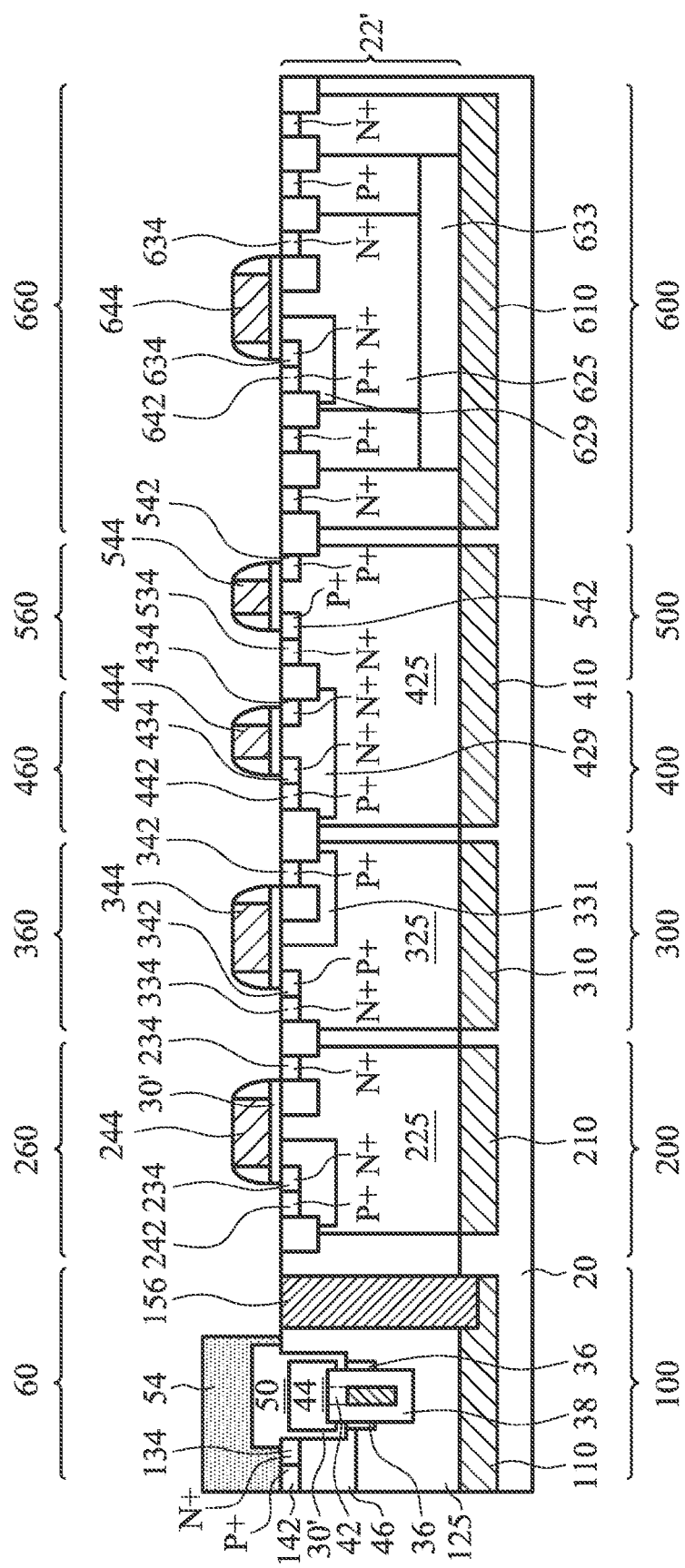

In FIG. 5C, LVW regions 229, 429, and 629 and PDD region 331 are formed through implantations. In addition, deep p-well region 633 is formed over NBL 610, and separates NBL 610 from the overlying HVNW region 625. A plurality of process steps is then performed, and the resulting devices are shown in FIG. 5D. The respective process steps are essentially the same as shown in FIGS. 4D through 4O, and the details may be found in the discussion of FIGS. 4D through 4O. In the resulting structure as shown in FIG. 5D, MOS devices 60, 260, 360, 460, and 560 are similar to the MOS devices as in FIG. 4O, except HVNW regions 125, 225, 325, 425, and 625 are different from what are in FIG. 4O. In addition, HVLNFMOS device 660 is formed in device region 600. HV LNFMOS device 660 has a channel length that may be adjusted by adjusting the overlapping length of LVW region 629 and the respective overlying gate electrode 644.

Figure 6A:
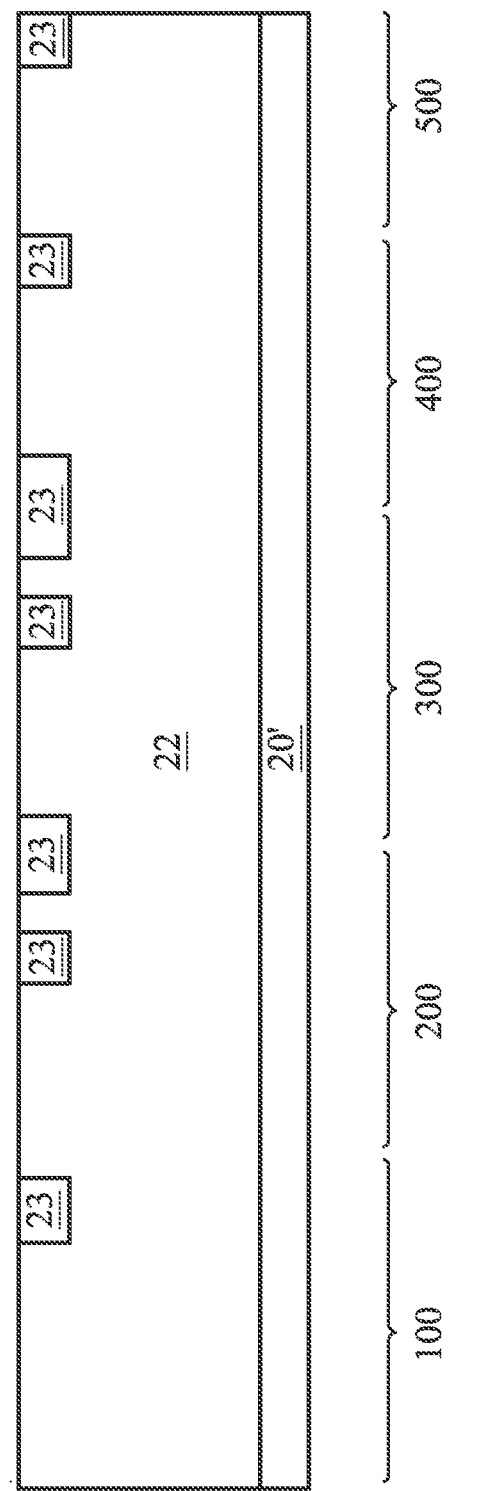

FIGS. 6A through 6O illustrate the cross-sectional views of intermediate stages in the integration of HVNMOS device 260, HVPMOS device 360, LVNMOS device 460, and LVPMOS device 560 with the formation of trench power MOSFET 60 in accordance with yet alternative embodiments. These embodiments are similar to the embodiments in FIGS. 4A through 4O, except that the electrical connections to the source and drain of trench power MOS device 60 are formed on the opposite sides of the respective substrate 20', which is of n-type in these embodiments.

Referring to FIG. 6A, N+ substrate 20' is provided. N+ substrate 20' has a high n-type impurity concentration, which may be between about $10^{19}/cm^3$ and about $10^{21}/cm^3$, for example. N-type epitaxy layer 22 is epitaxially grown on N+ substrate 20'. Next, STI regions 23 are formed, and extend from the top surface of epitaxy layer 22 into epitaxy layer 22.

In subsequent steps, as shown in FIG. 6B, pad oxide layer 24 is formed over epitaxy layer 22. LVW regions 229 and 429 and PDD region 331 are formed through implantations. Furthermore, HVNW regions 225, 325, and 425 are formed in device regions 200, 300, and 400/500, respectively, through the implantation of an n-type impurity. HVNW regions 225, 325, and 425 may extend partially into epitaxy layer 22, and are spaced apart from N+ substrate 20' by portions of epitaxy layer 22. Deep p-well regions 227, 327, and 427 are also formed underlying HVNW regions 225, 325, and 425, respectively.

The subsequent process steps in FIGS. 6C through 6N are essentially the same as shown in FIGS. 4C through 4N. The details of FIGS. 6C through 6N may thus be found in the discussion of FIGS. 4C through 4N. A brief process flow is discussed as follows. In FIG. 6C, hard mask layer 26 is formed and patterned, and trench 28 is formed using the patterned hard mask layer 26 as an etching mask to etch epitaxy layer 22. Oxide layer 30 is then formed, as shown in FIG. 6D. FIGS. 6E and 6F illustrate the deposition and the patterning of hard mask layer 32, and the tilt implantation for forming NDD region 36 using the patterned hard mask layer 32 as an implantation mask.

Figure 6H:
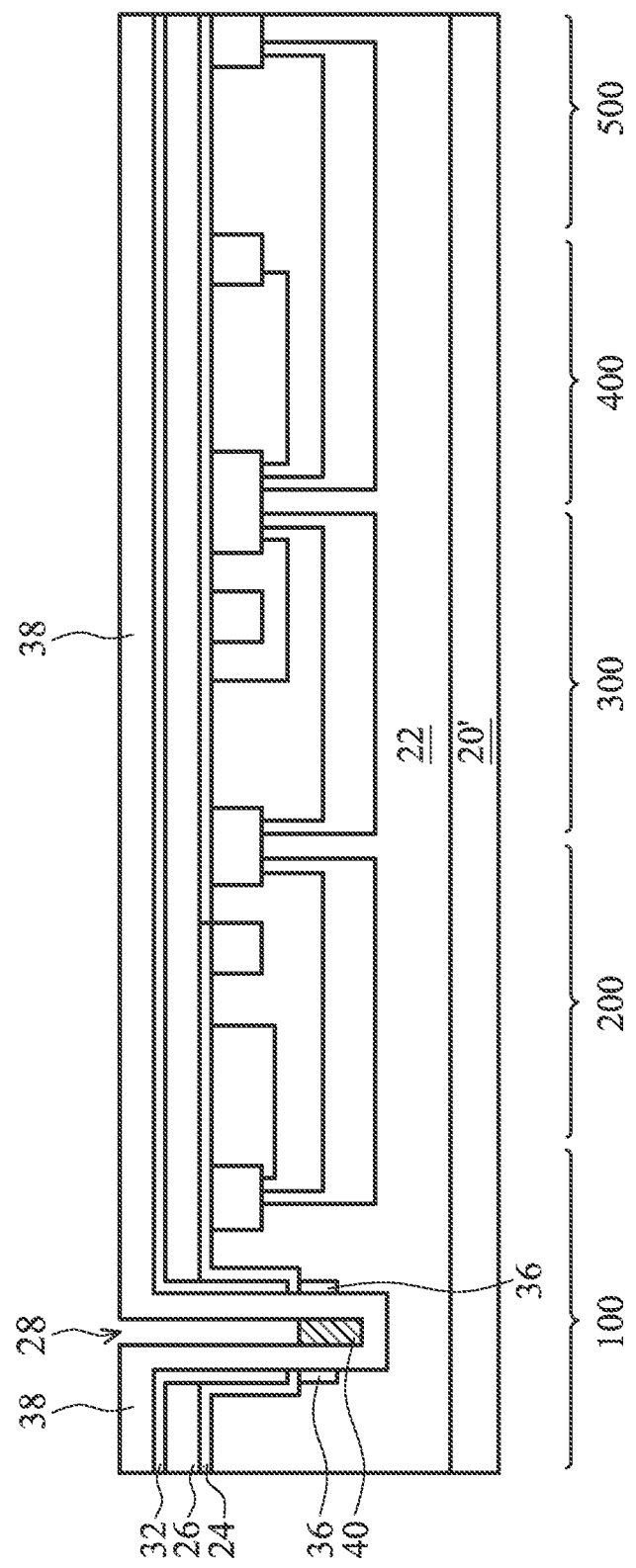
Figure 6I:
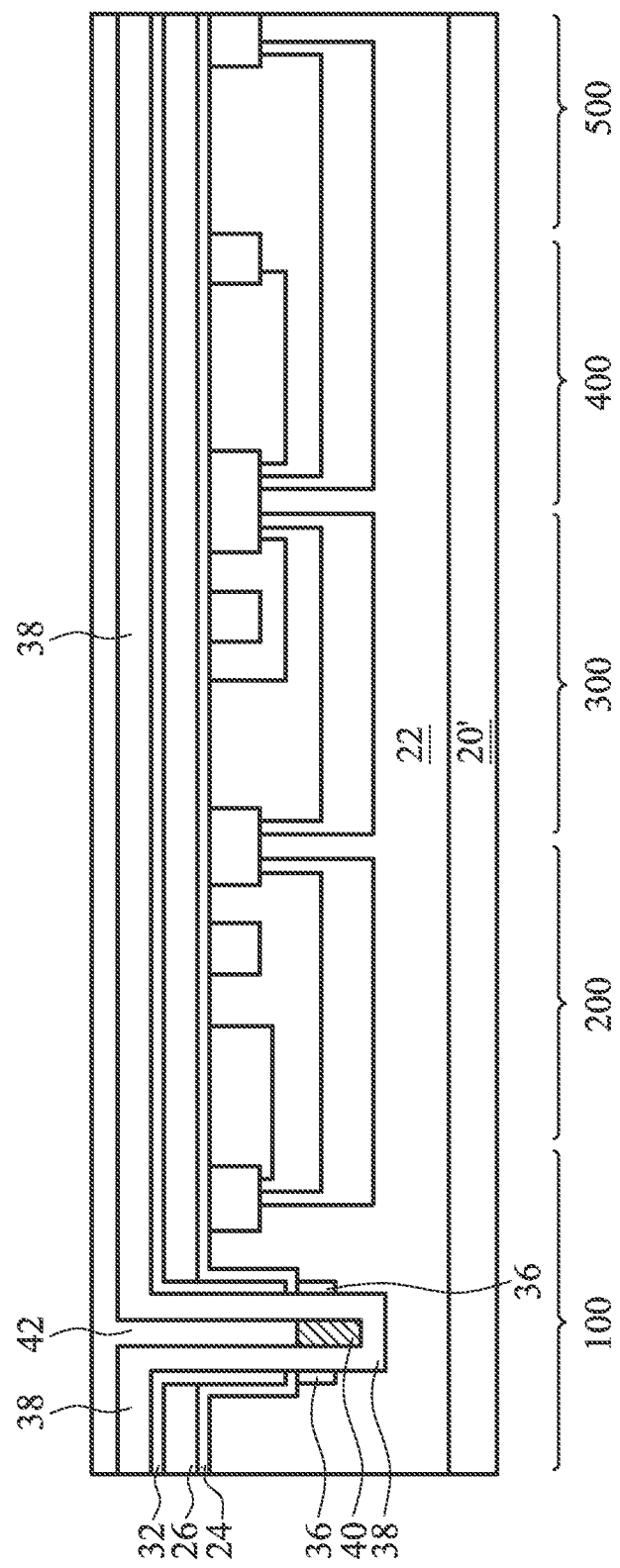

In FIG. 6G, trench 28 is extended down through NDD region 36 by etching. The resulting NDD region 36 includes portions on opposite sides of trench 28. FIG. 6H illustrates the formation of dielectric layer 38 and the formation of field plate 40. Dielectric layer 42 is then formed and etched back, as shown in FIGS. 6I and 6J, respectively. Next, hard mask layers 26 and 32 and oxide layers 24 and 30 are removed, and the resulting structure is shown in FIG. 6K. FIG. 6L illustrates the formation of gate dielectric layer 30'.

Figure 6N:
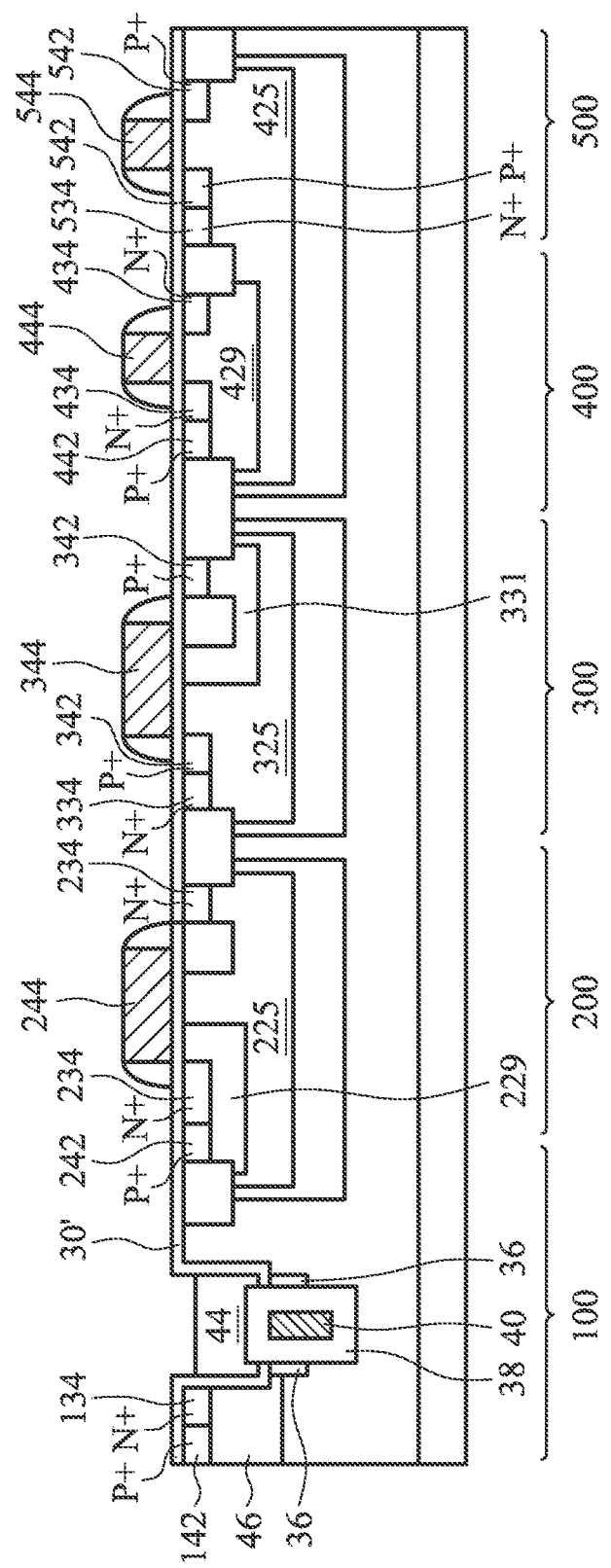
Figure 60:
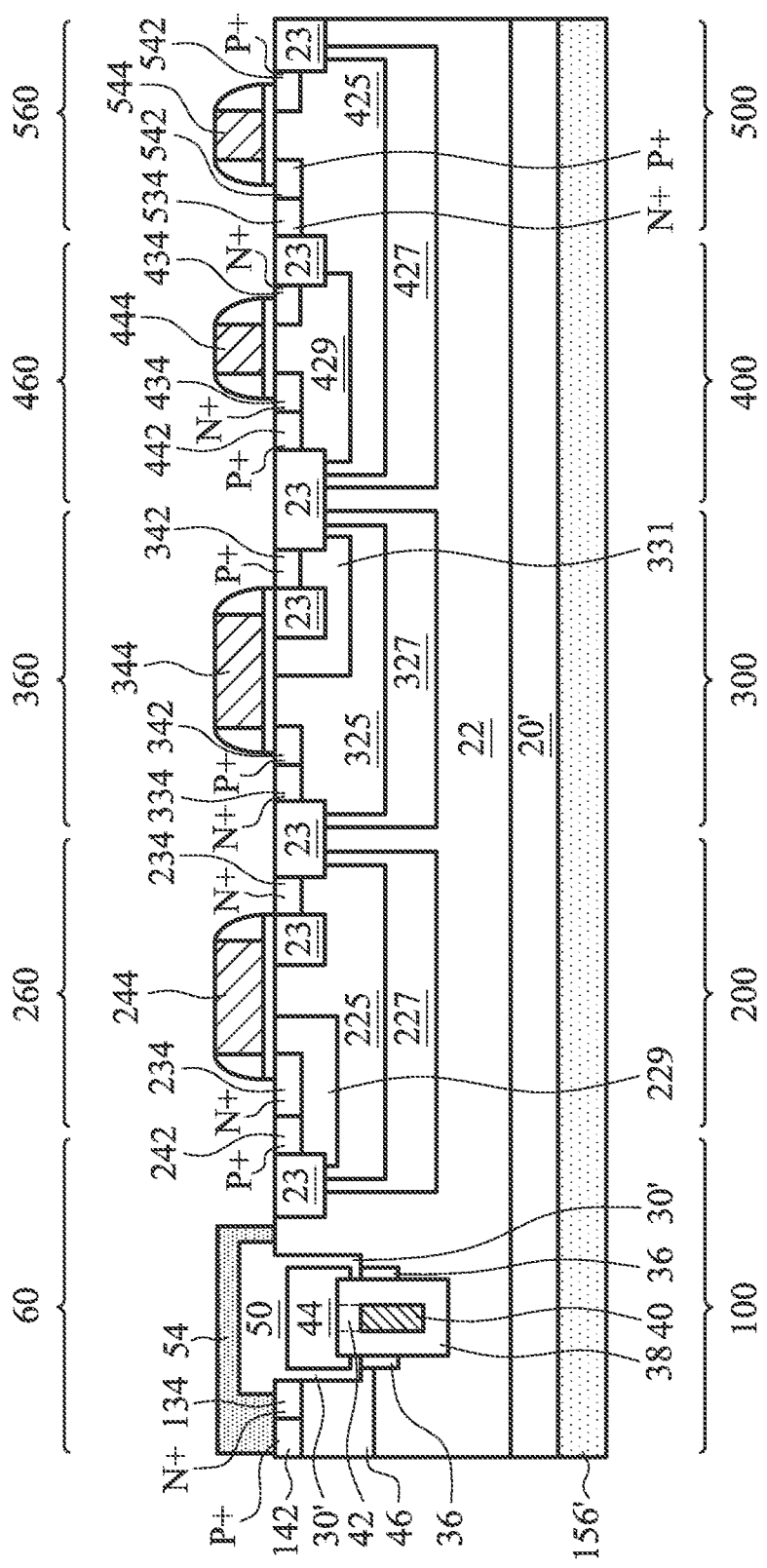

FIG. 6M illustrates the formation of main gate 44, and the formation of gate electrodes, 244, 344, 444, and 544 over gate dielectric layer 30'. In FIG. 6N, gate spacers 236, 336, 436, and 536 are formed, and N+ regions 134, 234, 334, 434, and 534 and P+ regions 142, 242, 342, 442, and 542 are formed through implantations.

In FIG. 6O, metal plate 156' is deposited on, and may be in physical contact with, N+ substrate 20'. Metal plate 156' and N+ substrate 20' act as the drain region of trench power MOSFET 60. On the other hand, source region 54 is formed over substrate 20', and over main gate 44 and field plate 40. Accordingly, the source and drain connections of trench power MOSFET 60 are on the opposite sides of the respective epitaxy layer 22, which forms a part of substrate. By forming the source and drain connections on opposite sides of a substrate, in subsequent packaging processes, the trench power MOSFET 60 may be easily stacked with other devices. The formation of MOS devices 60, 260, 360, 460, and 560 are thus finished.

In FIGS. 4A through 6O, the formation of various MOS devices, which are in different device regions and having different functions, are integrated. The formation of the various MOS devices may share same lithography masks. Structurally, the components of the MOS devices that are formed simultaneously may have a same type of impurity, a same depth, or the like. By sharing the lithography masks and the formation steps, the manufacturing cost is saved.

In accordance with embodiments, a device includes a semiconductor region of a first conductivity type, a trench extending into the semiconductor region, and a field plate in the trench, wherein the field plate is conductive. A first dielectric layer separates a bottom and sidewalls of the field plate from the semiconductor region. A main gate is disposed in the trench and overlapping the field plate. A second dielectric layer is disposed between and separating the main gate and the field plate from each other. A DD region of the first conductivity type is under the second dielectric layer, wherein an edge portion of the main gate overlaps the DD region. A body region includes a first portion at a same level as a portion of the main gate, and a second portion at a same level as, and contacting, the DD region, wherein the body region is of a second conductivity type opposite the first conductivity type. The device further includes a MOS containing device at a surface of the semiconductor region, wherein the MOS containing device is selected from the group consisting essentially of an HVNMOS device, an HVPMOS device, an LVNMOS device, an LVPMOS device, and combinations thereof.

In accordance with other embodiments, a device includes a semiconductor region of a first conductivity type selected from the group consisting essentially of p-type and n-type, and a trench extending from a top surface of the semiconductor region into the semiconductor region. A first dielectric layer is at a bottom and sidewalls of the trench. A field plate includes a bottom and sidewalls contacting the first dielectric layer, wherein the field plate is conductive. A main gate is in the trench and overlapping the field plate. A second dielectric layer is between and separating the main gate and the field plate from each other. A DD region of the first conductivity type includes a top surface contacting the second dielectric layer, and a sidewall contacting the first dielectric layer. The DD region has an impurity concentration greater than an impurity concentration of the semiconductor region. A MOS device is at a surface of the semiconductor region.

In accordance with yet other embodiments, a method includes epitaxially growing an epitaxy semiconductor region of a first conductivity type, forming a first trench in the epitaxy semiconductor region, and forming an implantation mask extending into the trench and covering edge portions of the trench. A tilt implantation is performed to form a DD region in the epitaxy semiconductor region, wherein the DD region includes portions overlapped by the implantation mask, and wherein the DD region is of a first conductivity type. The epitaxy semiconductor region is etched to extend into the epitaxy semiconductor region, wherein the step of etching is performed using the implantation mask as an etching mask. After the step of etching, a first dielectric layer is formed lining a bottom and sidewalls of the trench. A field plate is formed in the trench and over the first dielectric layer, wherein the field plate includes a bottom and sidewalls contacting the first dielectric layer. A second dielectric layer is formed over the field plate. A main gate is formed in the trench and over the second dielectric layer. A MOS device is further formed at a surface of the epitaxy semiconductor region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor region of a first conductivity type;
   a trench extending into the semiconductor region;
   a field plate in the trench, wherein the field plate is conductive;
   a first dielectric layer separating a bottom and sidewalls of the field plate from the semiconductor region;
   a main gate in the trench and overlapping the field plate;
   a second dielectric layer between and separating the main gate and the field plate from each other, wherein the second dielectric layer comprises a bottom surface;
   a Doped Drain (DD) region of the first conductivity type under the second dielectric layer, wherein an edge portion of the main gate overlaps the DD region, and the DD region comprises a to surface contacting a substantially horizontal bottom surface of the second dielectric layer, and a sidewall contacting the first dielectric layer, and wherein the main gate comprises a distinguishable vertical interface substantially aligned to an interface between the DD region and the first dielectric layer;
   a body region comprising a first portion at a same level as a portion of the main gate, and a second portion underlying and contacting the bottom surface of the second dielectric layer, wherein the body region is of a second conductivity type opposite the first conductivity type; and
   a Metal-Oxide-Semiconductor (MOS) containing device at a surface of the semiconductor region, wherein the MOS containing device is selected from the group consisting essentially of a High Voltage (HV)N-type MOS (HVNMOS) device, an HV P-type MOS (HVPMOS) device, a Low Voltage (LV)N-type MOS (LVNMOS) device, an LV P-type MOS (LVPMOS) device, and combinations thereof.

2. The device of claim 1, wherein the field plate and the main gate are comprised in a trench power MOS Field Effect Transistor (MOSFET), and wherein the trench power MOSFET further comprises:
   a source region comprising first portions over the field plate and the main gate; and
   a buried semiconductor layer of the first conductivity underlying the semiconductor region, wherein the buried semiconductor layer acts as a drain of the trench power MOSFET; and
   a metal deep via penetrating through the semiconductor region to contact the buried semiconductor layer.

3. The device of claim 1, wherein the field plate and the main gate are comprised in a trench power Metal-Oxide-Semiconductor Field Effect Transistor (MOSFET), and wherein the trench power MOSFET further comprises:
   a source region comprising first portions over the field plate and the main gate; and
   a drain region underlying the semiconductor region.

4. The device of claim 1, wherein the MOS containing device comprises the HNMOS device comprising:
   a Low Voltage Well (LVW) region of p-type;
   a gate electrode over the LVW region, wherein the LVW region extends from a source side of the HVNMOS device to underlying the gate electrode; and
   an n-type source region and an n-type drain region on opposite sides of, and adjacent to, the gate electrode, wherein the n-type source region is in the LVW region.

5. The device of claim 1, wherein the MOS containing device comprises the HVPMOS device comprising:
   a lightly doped drain region in the semiconductor region, wherein the lightly doped drain region is of p-type;
   a gate electrode over a portion of the lightly doped drain region; and
   a source region and a drain region of p-type on opposite sides of, and adjacent to, the gate electrode, wherein the drain region is spaced apart from gate electrode by a portion of the lightly doped drain region.

6. The device of claim 1, wherein the MOS containing device comprises the LVNMOS device.

7. The device of claim 1, wherein the MOS containing device comprises the LVPMOS device.

8. The device of claim 1, wherein the DD region contacts a sidewall portion of the first dielectric layer, and wherein the DD region has a bottom surface higher than a bottom surface of the field plate.

9. The device of claim 1, wherein the second dielectric layer comprises:
   a bottom surface contacting a top surface of the DD region; and
   a top surface contacting a bottom surface of the main gate.

10. A device comprising:
    a semiconductor region of a first conductivity type selected from the group consisting essentially of p-type and n-type;
    a trench power Metal-Oxide-Semiconductor Field Effect Transistor (MOSFET) comprising:
      a trench extending from a top surface of the semiconductor region into the semiconductor region;
      a first dielectric layer lining a bottom and sidewalls of the trench;

a field plate comprising a bottom and sidewalls contacting the first dielectric layer, wherein the field plate is conductive;

a main gate in the trench and overlapping the field plate;

a second dielectric layer between and separating the main gate and the field plate from each other; and a Doped Drain (DD) region of the first conductivity type, wherein the DD region comprises a top surface contacting a substantially horizontal bottom surface of the second dielectric layer, and a sidewall contacting the first dielectric layer, wherein the DD region has an impurity concentration greater than an impurity concentration of the semiconductor region, and wherein the main gate comprises a distinguishable vertical interface substantially aligned to an interface between the DD region and the first dielectric layer; and a lateral MOS device at a surface of the semiconductor region.

11. The device of claim 10, wherein the lateral MOS device comprises:

a doped region in the semiconductor region and of a second conductivity type opposite the first conductivity type;

a gate electrode, wherein the doped region extends from a source side of the MOS device to underlying the gate electrode; and a source region and a drain region on opposite sides of, and adjacent to, the gate electrode, wherein the source region is in the doped region, and wherein the source region and the drain region are of the first conductivity type.

12. The device of claim 11 further comprising:

a high voltage well region of the first conductivity type underlying the doped region, the gate electrode, and the drain region, wherein the drain region is in the high voltage well region;

a deep well region of the second conductivity type underlying the high voltage well region; and a buried well layer under the deep well region and of the first conductivity type.

13. The device of claim 10, wherein the lateral MOS device comprises:

a doped region in the semiconductor region and a second conductivity type opposite the first conductivity type;

a gate electrode, wherein the doped region extends from a drain side of the MOS device to underlying the gate electrode; and a source region and a drain region on opposite sides of, and adjacent to, the gate electrode, wherein the drain region is in the doped region, and wherein the source region and the drain region are of the second conductivity type.

14. The device of claim 10, wherein the trench power MOSFET further comprises:

a buried semiconductor layer of the first conductivity underlying the semiconductor region, wherein the buried semiconductor layer acts as a drain region of the trench power MOSFET; and a metal deep via penetrating through the semiconductor region to contact the buried semiconductor layer.

15. The device of claim 14, wherein the metal deep via extends to an intermediate level of the buried semiconductor layer, with the intermediate level being between a top surface and a bottom surface of the semiconductor layer.

16. A device comprising:

a semiconductor region of a first conductivity type;

a trench extending from a top surface of the semiconductor region into the semiconductor region;

a first dielectric layer lining a bottom and sidewalls of the trench;

a field plate comprising a bottom and sidewalls contacting the first dielectric layer, wherein the field plate is conductive;

a second dielectric layer over and contacting the field plate;

a Doped Drain (DD) region of the first conductivity type, wherein the DD region comprises a top surface contacting a substantially horizontal bottom surface of the second dielectric layer, and a sidewall contacting the first dielectric layer, wherein the DD region has an impurity concentration greater than an impurity concentration of the semiconductor region;

a main gate in the trench, wherein an edge portion of the main gate overlaps the DD region, wherein the second dielectric layer is between and separates the main gate and the field plate from each other, and wherein the main gate comprises a distinguishable vertical interface substantially aligned to an interface between the DD region and the first dielectric layer; and a lateral MOS device at a surface of the semiconductor region.

17. The device of claim 16, wherein the main gate overlaps the field plate.

18. The device of claim 16 further comprising a body region comprising a first portion at a same level as a portion of the main gate, and a second portion at a same level as, and contacting, the DD region, wherein the body region is of a second conductivity type opposite the first conductivity type.

19. The device of claim 16, wherein the main gate and the DD region form parts of a power Metal-oxide-Semiconductor Field Effect Transistor (MOSFET), and wherein the power MOSFET comprises a source over the main gate, and a drain underlying semiconductor region.

20. The device of claim 16, wherein the power MOSFET further comprises a heavily doped region of the first conductivity type between the semiconductor region and the drain.

21. The device of claim 16, wherein the DD region has a bottom surface higher than a bottom surface of the field plate.

* * * * *